United States Patent
Kenkel et al.

(10) Patent No.: US 11,874,711 B2
(45) Date of Patent: Jan. 16, 2024

(54) MULTI-CELL PHOTOVOLTAIC FOR A PORTABLE ELECTRONIC DEVICE

(71) Applicant: Garmin Switzerland GmbH, Schaffhausen (CH)

(72) Inventors: John M. Kenkel, Kansas City, KS (US); Mohamed Bouchoucha, Les Pennes Mirabeau (FR); Jing-Yi Wang, New Taipei (TW)

(73) Assignee: Garmin Switzerland GmbH

( * ) Notice: Subject to any disclaimer, the term of this patent is extended or adjusted under 35 U.S.C. 154(b) by 0 days.

(21) Appl. No.: 17/204,013

(22) Filed: Mar. 17, 2021

(65) Prior Publication Data

US 2021/0294395 A1 Sep. 23, 2021

Related U.S. Application Data

(60) Provisional application No. 62/992,519, filed on Mar. 20, 2020.

(51) Int. Cl.
*G06F 1/18* (2006.01)
*H01L 31/0465* (2014.01)
(Continued)

(52) U.S. Cl.
CPC .............. *G06F 1/189* (2013.01); *G06F 3/044* (2013.01); *H01L 31/048* (2013.01);
(Continued)

(58) Field of Classification Search
CPC ........ G06F 3/044; G06F 1/1613; G06F 1/189; H01L 31/0465; H01L 31/0468;
(Continued)

(56) References Cited

U.S. PATENT DOCUMENTS

| 2005/0189014 A1 | 9/2005 | Gaudiana et al. |
| 2010/0079387 A1 | 4/2010 | Rosenblatt et al. |

(Continued)

FOREIGN PATENT DOCUMENTS

| KR | 1020130024647 A | 3/2013 | |
| WO | WO-2013096131 A1 * | 6/2013 | ........... G02B 26/001 |
| WO | WO-2018062517 A1 * | 4/2018 | ............. B32B 23/00 |

OTHER PUBLICATIONS

U.S. Appl. No. 16/947,879, filed Aug. 21, 2020.
(Continued)

*Primary Examiner* — Kwin Xie
(74) *Attorney, Agent, or Firm* — Samuel M. Korte; Max M. Ali

(57) ABSTRACT

Systems and methods of generating electrical current from at least one photovoltaic cell are described herein. In some embodiments, a dual-cell arrangement of photovoltaic cells may be disposed on a face. Equal parts of a first photovoltaic cell and a second photovoltaic cell may be disposed on the face such that when a portion of the face is shaded, the first photovoltaic cell and the second photovoltaic cell receive substantially equal amounts of electromagnetic radiation. In some embodiments, the first photovoltaic cell and the second photovoltaic cell comprises a plurality of sub-cell connected in series and parallel to optimize the power output form the partially exposed cells.

15 Claims, 17 Drawing Sheets

(51) Int. Cl.
*H01L 31/048* (2014.01)
*H01L 31/0468* (2014.01)
*G06F 3/044* (2006.01)
*G01P 15/00* (2006.01)
*G02F 1/133* (2006.01)
*G02F 1/1333* (2006.01)
*G06F 1/16* (2006.01)
*G01S 19/13* (2010.01)

(52) U.S. Cl.
CPC ...... *H01L 31/0465* (2014.12); *H01L 31/0468* (2014.12); *G01P 15/00* (2013.01); *G01S 19/13* (2013.01); *G02F 1/13324* (2021.01); *G02F 1/13338* (2013.01); *G06F 1/1613* (2013.01)

(58) Field of Classification Search
CPC .... H01L 31/048; G01P 15/00; G02F 1/13324; G02F 1/13338; G01S 19/13
USPC .................................................. 345/173–174
See application file for complete search history.

(56) References Cited

U.S. PATENT DOCUMENTS

| 2013/0284231 | A1  | 10/2013 | Stein |
|---|---|---|---|
| 2014/0152632 | A1* | 6/2014 | Shedletsky ...... H04N 21/42202 250/208.2 |
| 2015/0349206 | A1* | 12/2015 | Lowenthal ............ H01L 31/048 257/459 |
| 2016/0098115 | A1* | 4/2016 | Ren .................... H01L 31/02325 345/174 |
| 2016/0274699 | A1* | 9/2016 | Shishido ................ G02F 1/1333 |
| 2016/0349558 | A1* | 12/2016 | Shishido ............. G02F 1/13338 |
| 2016/0351552 | A1* | 12/2016 | Takahashi ........... G06F 3/04182 |
| 2017/0170332 | A1* | 6/2017 | Yamazaki ........... H01L 27/1225 |
| 2017/0256654 | A1* | 9/2017 | Yamazaki ......... H01L 29/66969 |
| 2017/0351141 | A1* | 12/2017 | Kubota ............. G02F 1/133711 |
| 2017/0359018 | A1* | 12/2017 | Rhee ..................... H01L 31/042 |
| 2018/0028133 | A1  | 2/2018 | Jones et al. |
| 2019/0384354 | A1  | 12/2019 | Badinski et al. |
| 2020/0124892 | A1  | 4/2020 | Hanshew |
| 2021/0088820 | A1  | 3/2021 | Hanshew |

OTHER PUBLICATIONS

U.S. Appl. No. 17/203,996, filed Mar. 17, 2021.
U.S. Appl. No. 17/204,017, filed Mar. 17, 2021.
International Search Report and Written Opinion from PCT/US/2021/022759, dated Jul. 7, 2021.
International Search Report and Written Opinion from PCT/US/2021/022768, dated Jun. 21, 2021.
International Search Report and Written Opinion from PCT/US/2021/022771, dated Jun. 25, 2021.

* cited by examiner

MULTI-CELL PHOTOVOLTAIC FOR A PORTABLE ELECTRONIC DEVICE

RELATED APPLICATIONS

This non-provisional patent application claims priority benefit, with regard to all common subject matter, of earlier-filed U.S. Provisional Patent Application No. 62/992,519, filed Mar. 20, 2020, and entitled "MULTI-CELL PHOTOVOLTAIC." The identified earlier-filed provisional patent application is hereby incorporated by reference in its entirety into the present application.

BACKGROUND

Conventional wearable electronic devices, like smartwatches, GPS navigation devices, fitness trackers, etc. utilize touchscreens to provide a user interface to users of the electronic devices. Battery life is important for these devices as space is limited. The battery may need to be charged on a regular basis and it can be aggravating for users to stop wearing a device for recharging. Some attempts have been made to equip smartwatches with semitransparent solar panels such as by using a discrete solar cell positioned on top of or over the watch's display. However, the positioning of the photovoltaic cells on a mobile device, watch, tablet, or other portable electronic device may be shaded by the user, the user's clothing, trees, or the like. When a first cell is shaded more or less than a second cell in a multi-cell system, power generation efficiency is decreased. Further, photovoltaic cells typically require a boost integrated circuit (IC). A boost IC is often needed to boost lower solar cell voltage up to battery voltage to harvest energy. Unfortunately, the boost IC is not 100% efficient and limits the energy harvested.

SUMMARY

Embodiments of the present invention provide a first embodiment directed to a photovoltaic power system for a portable electronic device, the photovoltaic power system comprising a first photovoltaic cell and a second photovoltaic cell disposed on a face, each of the first photovoltaic cell and the second photovoltaic cell comprising a first layer comprising a first conductive electrode, a second layer electrically connected to the first layer and configured to generate electrical current when exposed to electromagnetic radiation, and a third layer comprising a second conductive electrode, wherein substantially equal parts of the first photovoltaic cell and the second photovoltaic cell are disposed on a first half of the face and a second half of the face.

A second embodiment is directed to a photovoltaic power system for a portable electronic device, the photovoltaic power system comprising a first photovoltaic cell and a second photovoltaic cell disposed on a face, each of the first photovoltaic cell and the second photovoltaic cell comprising, a first layer comprising a first conductive electrode, a second layer electrically connected to the first layer and configured to generate electrical current when exposed to electromagnetic radiation, and a third layer comprising a second conductive electrode, wherein substantially equal parts of the first photovoltaic cell and the second photovoltaic cell are distributed over the face, and wherein layers of the first photovoltaic cell are disposed between layers of the second photovoltaic cell.

A third embodiment is directed to a photovoltaic power system for a portable electronic device, the photovoltaic power system comprising at least one photovoltaic cell disposed on a face, comprising a first layer comprising a transparent conductive oxide, a second layer electrically connected to the first layer and configured to generate electrical current when exposed to electromagnetic radiation, and a third layer comprising a conductive electrode, at least one exterior photovoltaic cell disposed on a bezel substantially encircling the face.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the invention will be apparent from the following detailed description of the embodiments and the accompanying drawing figures.

BRIEF DESCRIPTION OF THE DRAWING FIGURES

Embodiments of the invention are described in detail below with reference to the attached drawing figures, wherein.

Figure 14:
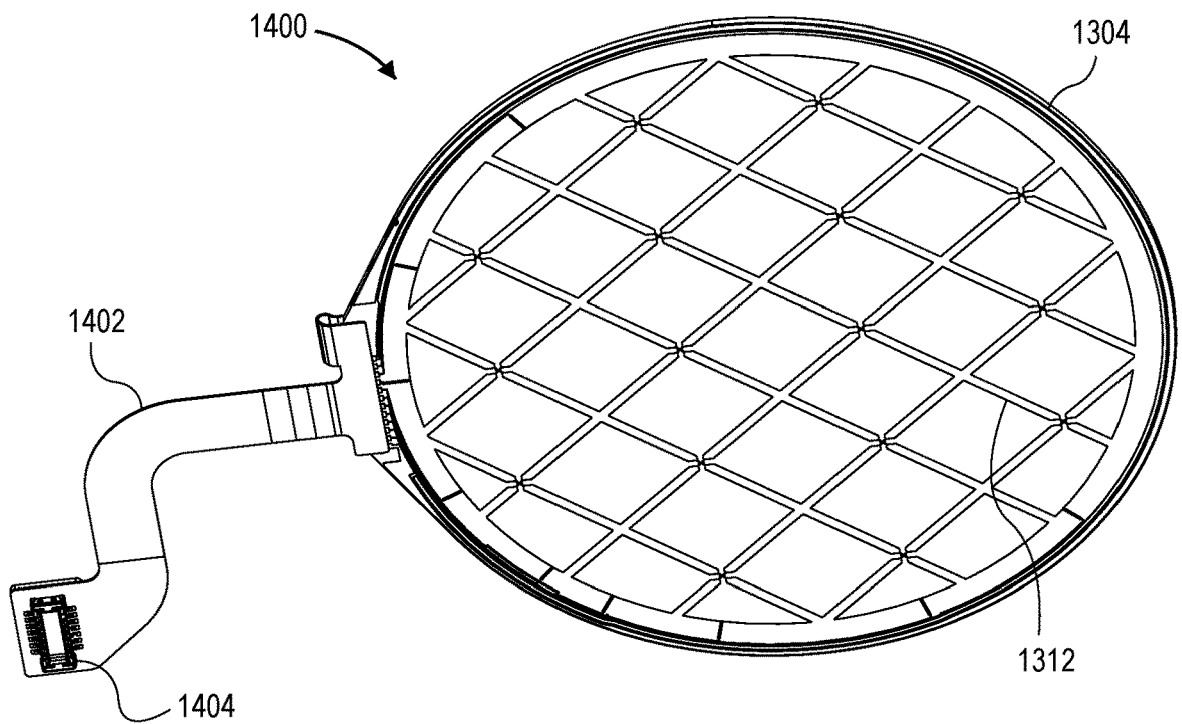
Figure 15:
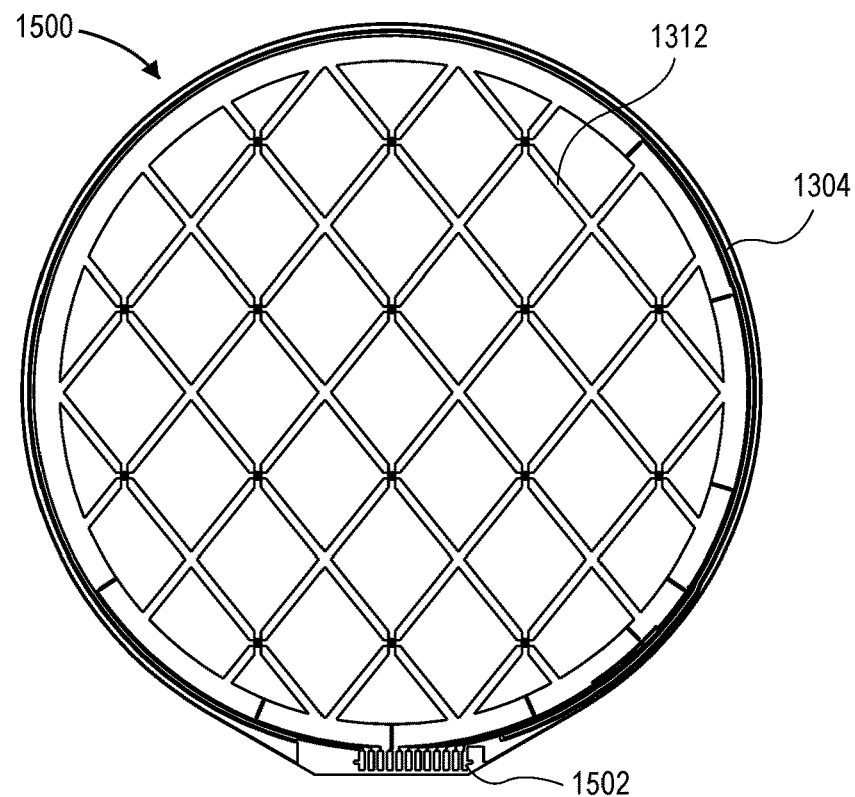
Figure 16:
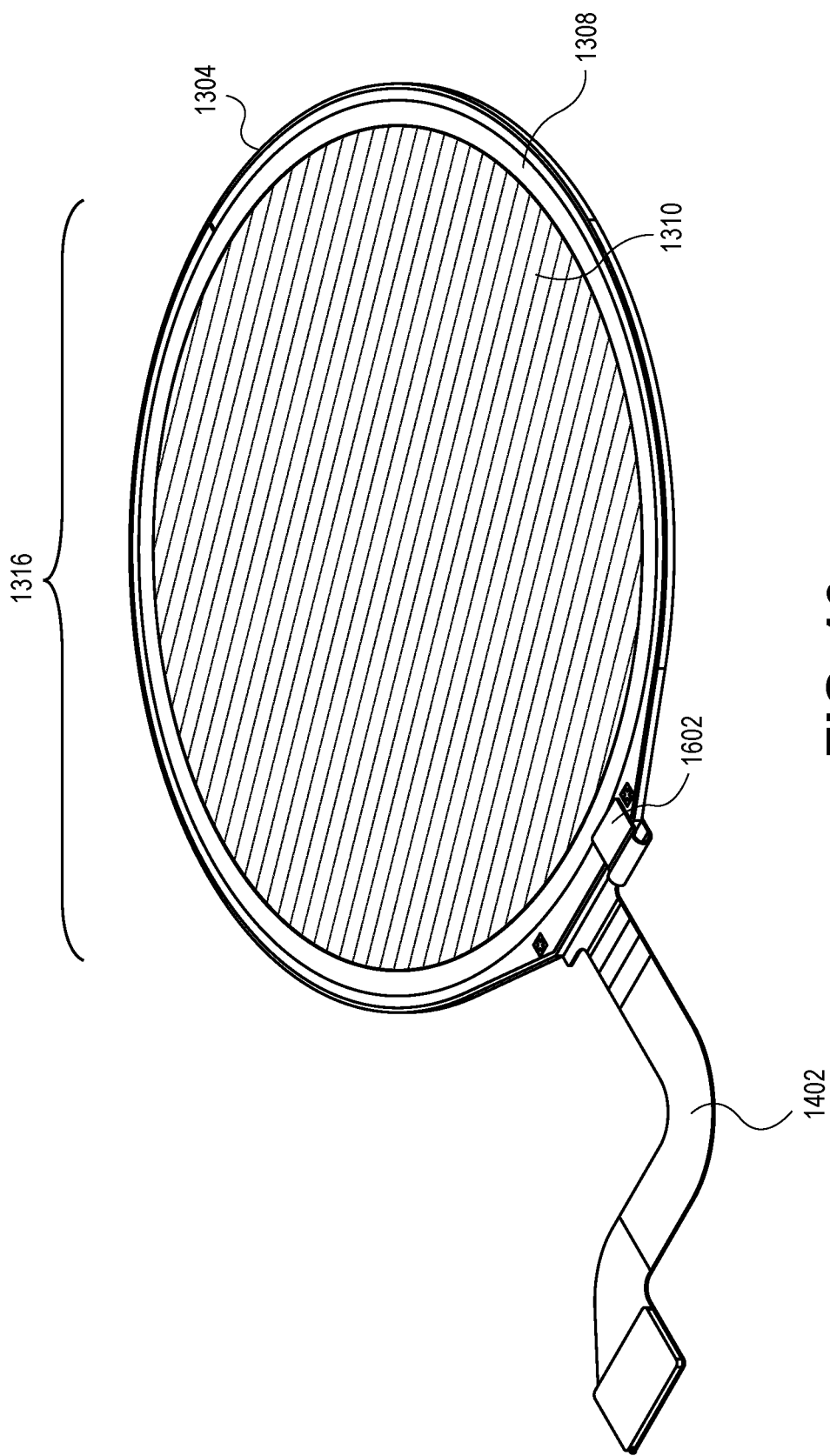
Figure 17:
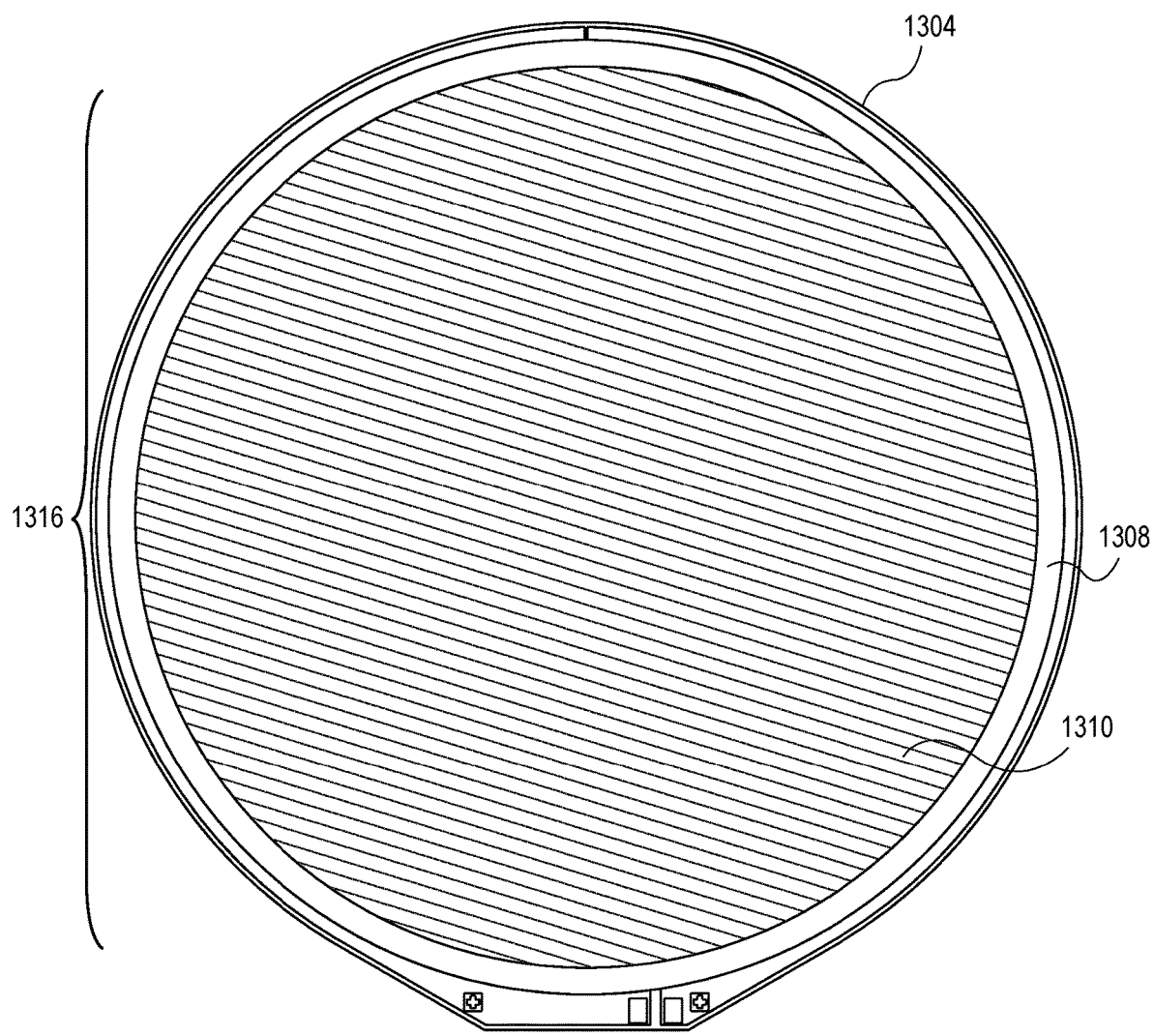

FIGS. 14 and 15 depict a touch sensor on a front face of the common base layer; and FIGS. 16 and 17 depict a photovoltaic surface comprising photovoltaic cells on a face of the common base layer of FIGS. 14 and 15.

The drawing figures do not limit the invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the invention. The following detailed description is, therefore, not to be taken in a limiting sense. The scope of the invention is defined only by the appended claims, along with the full scope of equivalents to which such claims are entitled.

In this description, references to "one embodiment," "an embodiment," or "embodiments" mean that the feature or features being referred to are included in at least one embodiment of the technology. Separate references to "one embodiment," "an embodiment," or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments but is not necessarily included. Thus, the technology can include a variety of combinations and/or integrations of the embodiments described herein.

In general, embodiments of the invention are directed to systems and methods for providing photovoltaic cells on portable electronic devices such that a high level of power is generated when a portion of the photovoltaic cells are exposed to electromagnetic radiation. A portion of the photovoltaic cells may be shaded such that a low amount, or no electromagnetic radiation is received from the shaded cells. In some embodiments, a plurality of photovoltaic cells may be connected in series to boost the power generated and some of the plurality of photovoltaic cells may be connected in parallel to reduce the effects of shading on the photovoltaic cells that are not shaded.

Multiple photovoltaic cells in series boosts system efficiency. However, if an entire cell is shaded (having no current flowing through it), then no power is generated from the entire solar module because the current through all cells in series must be the same. If one cell is covered such as, for example, by a user's shirt sleeve, the current flowing through that one cell limits the current flowing through all other cells exposed to the sun. By having a string of cells in parallel with one or more other sets of cells which are strategically located in relation to the first set, a photovoltaic module can still harvest a meaningful amount of solar energy even if one or more of the cells are shaded. One challenge is routing the high-conductivity bus bar to collect the energy. By adding additional insulation and routing layers, vias can be used similarly to how vias are used in printed circuit boards (PCBs) with insulation around the vias. Providing insulated vias results in low-impedance paths from one layer to another. Having multiple strings of cells in series helps shading both from the west/east direction (left/right shown in the FIGS) and from the north/south direction (up/down shown in the FIGS). Further, the photovoltaic cells described herein may have a plurality of sub-cells strung together in series. This is important because it increases the efficiency and minimizes the impact of shadowing from west/east, but it also reduces the impact of shadowing from the north/south depending on the orientation and arrangement of the sub-cells. FIGS. 1A-9 illustrate various arrangements of the multi-cell designs that may reduce the effects of shading on power generation.

In an exemplary embodiment, photovoltaic designs may be optimized for shading from user sleeves (or other obstacles) at different positions across a solar cell for both right hand and left hand wear to improve watch system efficiency. In a dual-cell configuration, the dual-cell design may use the transparency area (face of the watch) with vias to optimize for shadowing from shirt sleeves or jackets by balancing a solid photovoltaic (PV) ring with the transparent region. An amorphous silicon (a-Si) single solar cell typically operates at 0.75V at maximum power output. A dual cell will operate at twice this voltage (1.5V) while producing half the current. Since current is half, the conductive losses are lowered. A separate integrated circuit (IC) is typically used to boost the cell voltage to battery voltage. The average voltage for a lithium-ion polymer is typically ~3.8V with max charge voltage of 4.35V. Boosting from 0.75V to 3.8V is a multiple of approximately 5. The higher the multiple, the more loss there is in the boost IC voltage conversion. Therefore, a dual cell design reduces this multiple, increases the IC boost efficiency, and improves overall system efficiency. In some embodiments, a design having more than two cells in series may be employed. In some embodiments, a plurality of cells may be employed in series.

Example multi-cell photovoltaic cell designs are illustrated in FIGS. 1A-9 depicting photovoltaic module 100 including first cell 102 and second cell 104 wherein first cell 102 and second cell 104 are photovoltaic cells in a dual-cell design as described above. First cell 102 and second cell 104 are arranged to provide current even if part of photovoltaic module 100 is partially shaded from any direction. Thus, for example, if photovoltaic module 100 is incorporated as face 112 (e.g., surface) of a smartwatch as described below, photovoltaic module 100 may still generate electrical current even if a west (left) portion of face 112 is blocked (shaded) by a user's sleeve. The illustrated examples are only some various possible configurations of a multi-cell design where two or more cells are distributed across photovoltaic module 100 to ensure that each of the cells may generate some current even if portions of the device are blocked from the sun. In example configurations involving smartwatches, shading from the left (west) or right (east) is often caused by a user's sleeve. In a dual-cell example, ensuring that each cell is somewhat equally represented (e.g., near 50%) in each left/right hemisphere enables photovoltaic module 100 to generate current even if much of the device is obscured from either side.

The illustrated examples depicted in FIGS. 1A-9, include interior cells, first cell 102 and second cell 104 as well as exterior cells, first exterior cell 106 and second exterior cell 108. The exterior cells may themselves be independent cells provided on bezel 110 or may comprise first cell 102 and second cell 104. First exterior cell 106 and second exterior cell 108 may have varying photovoltaic density and/or transparency from other cells of the same type. For example, in smartwatch configurations described below, the cells provided on bezel 110 (i.e., first exterior cell 106 and second exterior cell 108) of photovoltaic module 100 may be opaque (or semi-opaque) while center portions of photovoltaic module 100 are desirably less opaque to allow users to view displays or other mechanisms positioned under photovoltaic module 100.

Continuing with FIGS. 1A-3 depicting various arrangements of photovoltaic module 100, photovoltaic module 100 may comprise first cell 102, second cell 104, first exterior cell 106, and second exterior cell 108. In some embodiments, first cell 102 comprises first exterior cell 106 and second cell 104 comprises second exterior cell 108. In some embodiments, first cell 102 and second cell 104 comprise a plurality of photovoltaic cells connected in series. In some embodiments, first cell 102 is configured with several portions separated by portions of second cell 104. In these separated arrangements, the portions of first cell 102 may be connected by insulated vias. Similarly, separated portions of second cell 104 may be connected by insulated vias. In embodiments where the exterior cells are portions of first cell 102 and second cell 104, the exterior cells may be connected by insulated vias. Further, the insulated vias may be connected to a bus for collecting the electrical energy generated by the photovoltaic cells.

Figure 1A:
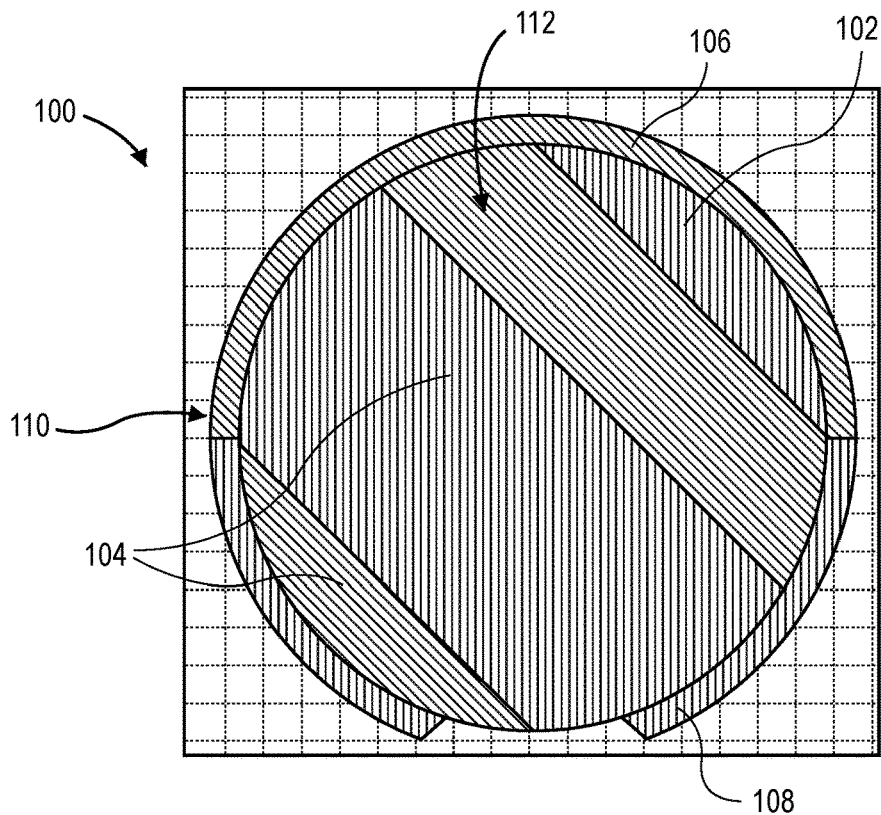
FIG. 1A depicts an exemplary embodiment of photovoltaic cell arrangements on a photovoltaic surface.

FIG. 1A depicts a first configuration of photovoltaic module 100. First cell 102 comprises three portions, two on an interior portion (e.g., face 112 and one on bezel 110). Second cell 104 comprises three portions as well, two on face 112 and one on bezel 110. In some embodiments, portions of first cell 102 are separated by portions of second cell 104 as shown. First cell 102 portions may be connected by insulated vias such that the portions are strung together in series. Similarly, the portions of second cell 104 may be strung together in series using insulated vias as well. Further, each portion of first cell 102 and second cell 104 may comprise a string of photovoltaic cells connected in series. Further still, FIG. 1A depicts first exterior cell 106 and second exterior cell 108 on bezel 110. First exterior cell 106 may be a portion of first cell 102 and connected to first cell 102 in series. In some embodiments, first exterior cell 106 may be electrically connected to other cells in parallel such that if other cells are shaded, first exterior cell 106 continues to generate power. Many combinations of cell arrangements may be used.

In some embodiments, first cell 102 and second cell 104 may also be configured at an angle relative to the locations of the exterior cells. First cell 102 and second cell 104 may be arranged at an angle of approximately 45 degrees to the north/south (up/down). First exterior cell 106 and second exterior cell 108 may be positioned with one on the north half of bezel 110 and one on the south half of bezel 110. The arrangement of the photovoltaic cells provides high individual cell coverage across multiple locations on face 112 and bezel 110 such that if a portion of face 112 and bezel 110 portions are covered by the sun, each cell may have similar coverage thus resulting in a similar power output. As described above, the balance of cells that are shaded should be approximately equal to provide the highest power output. The location and arrangement of the plurality of cells may be optimized based on a particular use case to provide the highest efficiency, or least loss based on shading area.

Figure 1B:
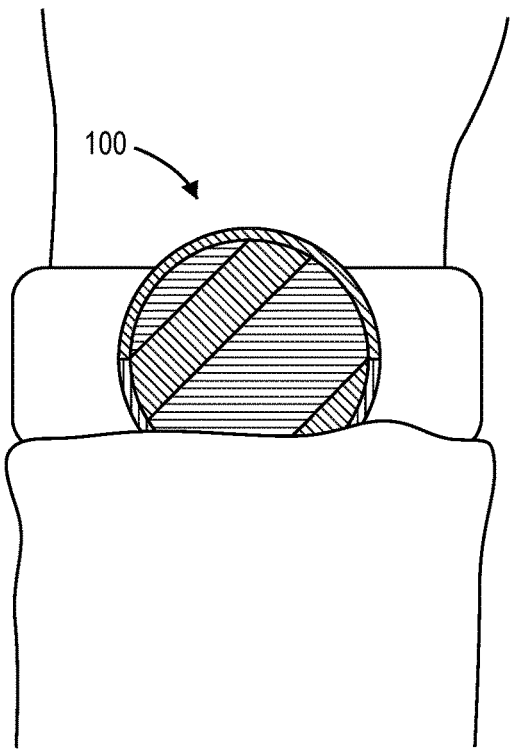
FIG. 1B depicts the exemplary arrangement of FIG. 1A with a shirt sleeve partially covering the photovoltaic surface.

For example, as depicted in FIG. 1B, photovoltaic module 100 depicted in FIG. 1A may be attached to a smartwatch. When the smartwatch is on a user's wrist and the user's hand is hanging at their side, a portion of the south side of the watch may be covered by a long sleeve of the user. In this case, a first exterior cell may be exposed to the electromagnetic radiation. However, a larger portion of second cell 104 at face 112 section is exposed. Consequently, an area of first cell 102 and an area second cell 104 exposed to the electromagnetic radiation is approximately equivalent resulting in a ratio of 1:1 between exposure of first cell 102 and exposure of second cell 104. The result is a high power output by photovoltaic module 100.

Figure 2:
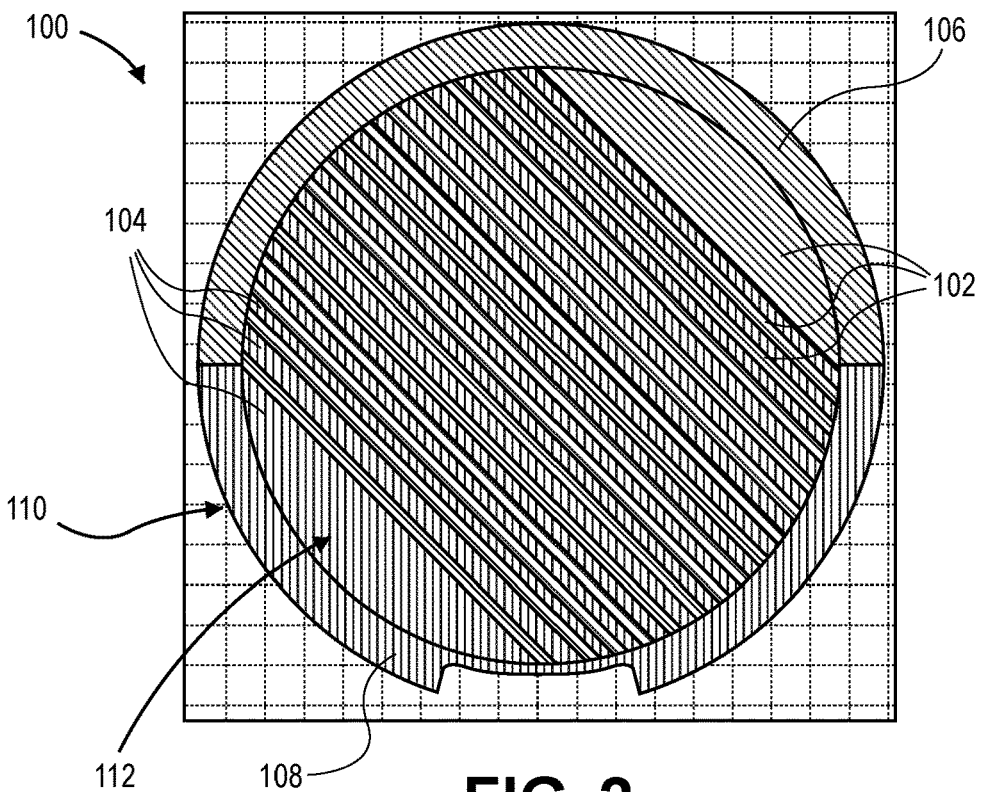
FIGS. 2 and 3 depict exemplary embodiments of photovoltaic cell arrangements on a photovoltaic surface.
Figure 3:
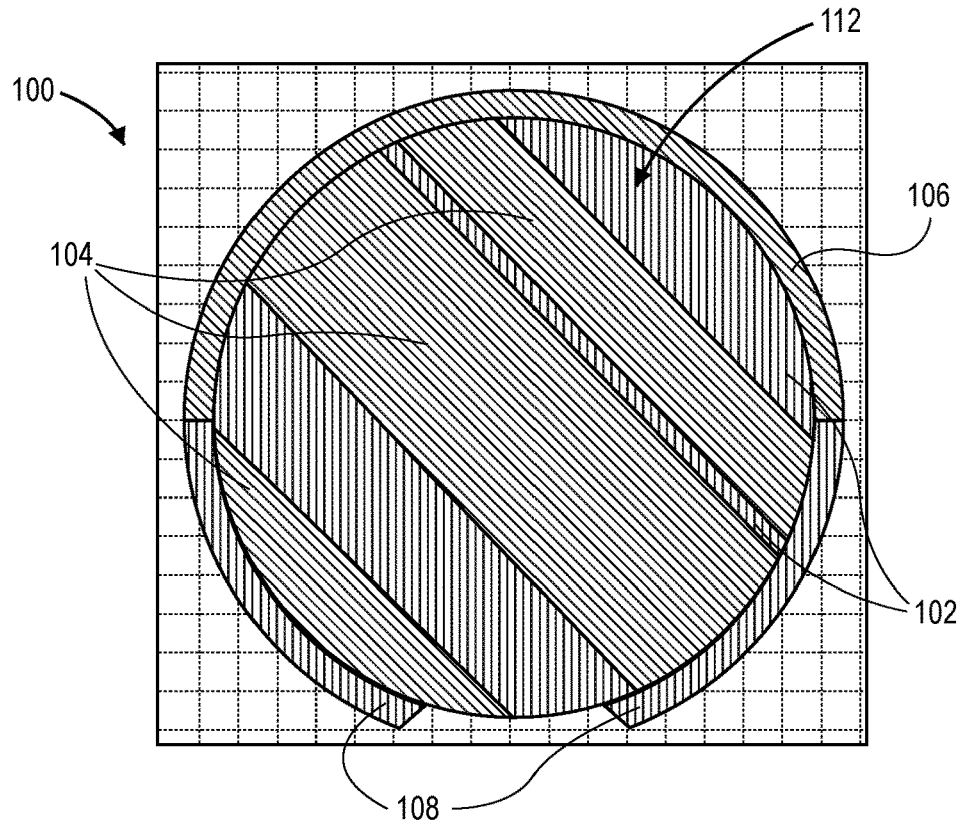

FIG. 2 and FIG. 3 depict photovoltaic module 100 comprising first cell 102, second cell 104, first exterior cell 106, and second exterior cell 108 in varying configurations. FIG. 2 comprises many portions of first cell 102 interconnected between many portions of second cell 104. A larger portion of first cell 102 is provided on an outer area to the northeast side of face 112 while a large portion of the second cell is provided on a southwest portion of face 112. The larger portions are disposed opposite such that if a section of face 112 is shaded, the unshaded portions of first cell 102 and second cell 104 are approximately equivalent in exposure and can generate power efficiently. Similarly, FIG. 3 presents an arrangement of cells that may be optimized for a specific use case.

Figure 4:
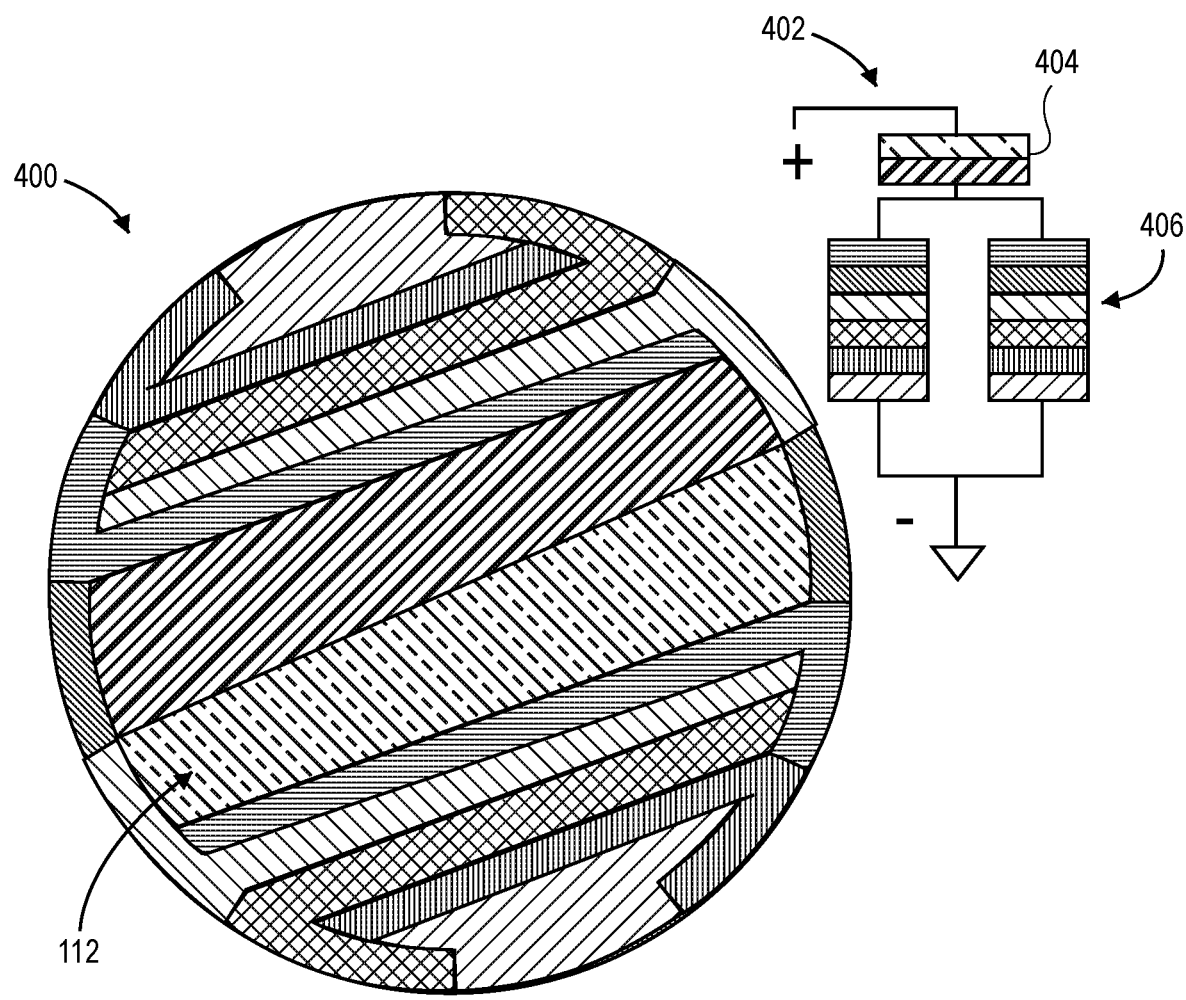
FIGS. 4 and 5 depict exemplary embodiments connecting some photovoltaic cells in series and some photovoltaic cells in parallel.

FIG. 4 illustrates an example embodiment of photovoltaic module 100 that includes series and parallel cells that may optionally eliminate a boost IC generally referenced by numeral 400. A boost IC is often needed to boost the lower solar cell voltage up to battery voltage to harvest energy as described above. By connecting a specific number of cells in series to output a voltage that is the same as battery voltage, the boost IC can be removed. Also, multiple cells can be arranged in series and parallel to limit the effects of shading from west/east and north/south as shown in cell arrangement diagram 402. Multiple routing layers as suggested above can be implemented. Such a design may be optimized to take into account and reduce shadowing effects. As described above, face 112 may be the substantially transparency region comprising the inner portion of photovoltaic module 100 including first cell 102 and second cell 104 but not bezel 110, which includes first exterior cell 106 and second exterior cell 108.

Figure 5:
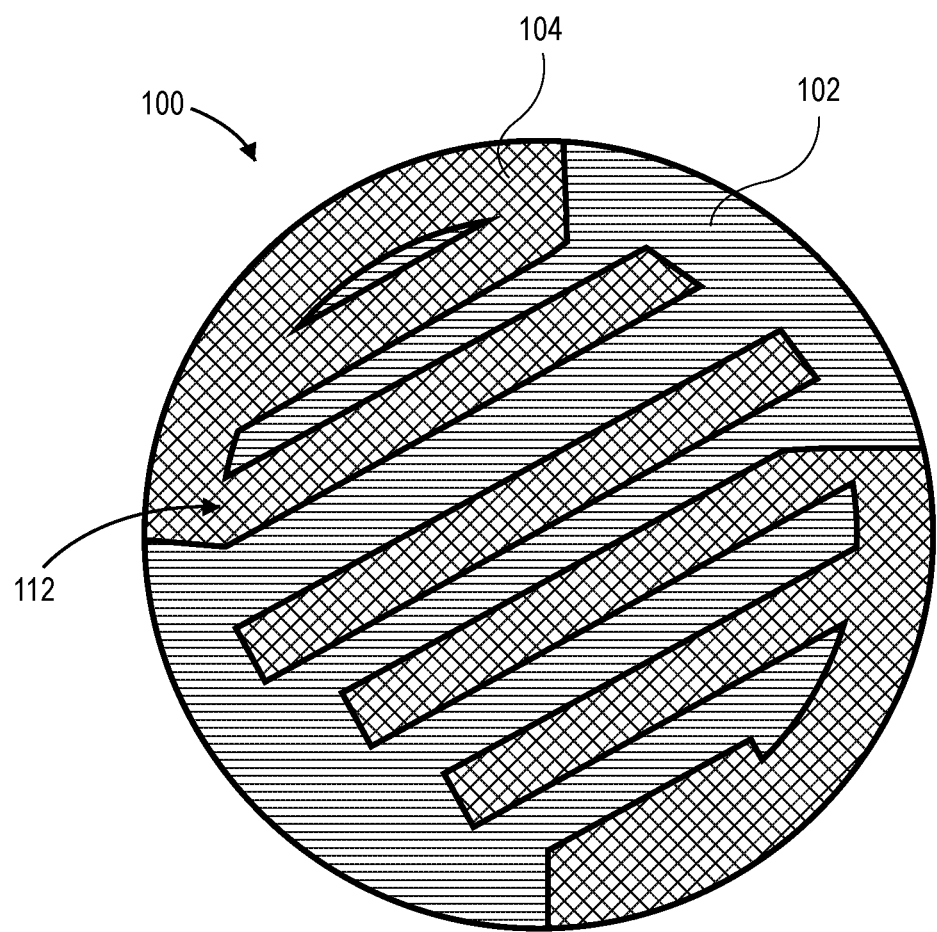

In the embodiment depicted in FIG. 4, photovoltaic module 100 may comprise a plurality of photovoltaic cells. As shown in cell arrangement diagram 402, portions of the interior cells may be connected in series and may be connected in parallel with other portions of the interior cells. The arrangement may be optimized based on an expected shadowed portion of face 112. Using the example provided in FIG. 1B of the smartwatch above, the south portion of face 112 may be expected to be covered. As such, the interior cells may be configured to generate power when the northern portion is exposed to the electromagnetic radiation. Combinations of parallel and series cells can be used to achieve any desired electrical configuration. The example of FIG. 4 provides two cells in series 404 with a parallel combination of two strings 406 of six cells in series. One or more cells may be positioned 180 degrees from corresponding opposite cells so if one is covered from an edge, or a sleeve, the other still generates power. FIG. 5 depicts an exemplary configuration of a dual-cell design. The cells may be separated similarly to the cell configuration in FIG. 4 and the cells may be configured at different angles such that one may be exposed while the other is not.

FIG. 5 presents an embodiment of a dual-cell design of photovoltaic module 100 comprising first cell 102 and second cell 104. In some embodiments, portions if first cell 102 that are disposed in northern hemisphere of face 112 may be connected in series with portions of first cell 102 disposed in a southern hemisphere of face 112. Similarly, portions of second cell 104 disposed in the northern hemisphere of face 112 may be connected in series and connected in parallel with portions of second cell 104 disposed in the southern hemisphere. In this way, when the electromagnetic radiation is shaded on the southern hemisphere the northern hemisphere will efficiently generate current.

FIGS. 6-9 depict photovoltaic module 100 with rectangular face 112. In the rectangular examples of FIGS. 6-9, bezel 110 may be enlarged compared to the more circular examples of FIGS. 1A-4. Enlarged bezel 110 may provide more area for coverage of the exterior cells (i.e., first exterior cell 106 and second exterior cell 108). Such rectangular configurations with enlarged bezel areas of 100% photovoltaic coverage may be useful, for example, in bicycle computer products where a cyclist's shadow may cover parts of photovoltaic module 100 during a ride or where the cyclist parks his or her bike in the shade.

Figure 6:
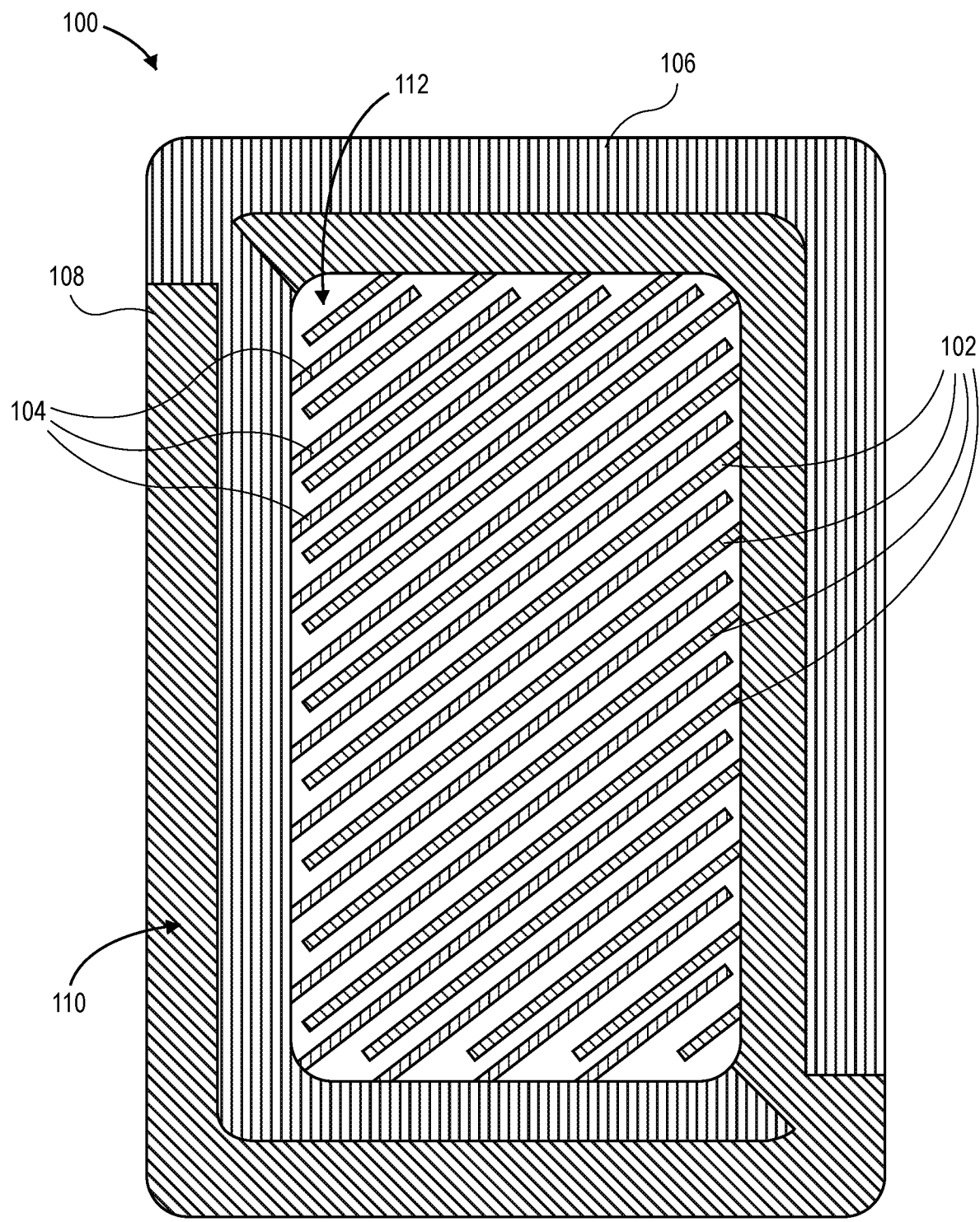
FIGS. 6-9, depict exemplary embodiments of photovoltaic cell arrangements on a photovoltaic surface on a tablet-type electronic device.
Figure 7:
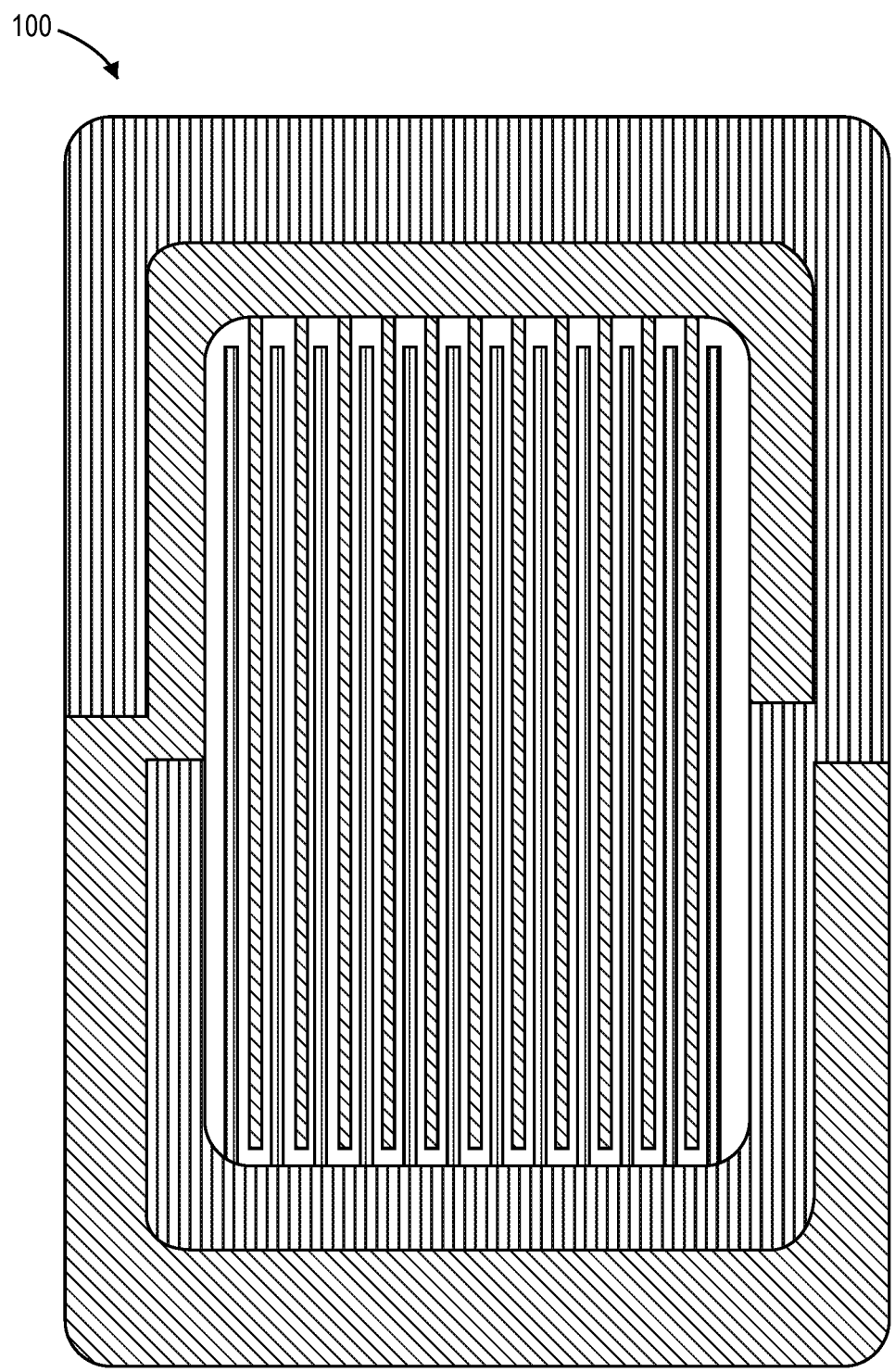
Figure 8:
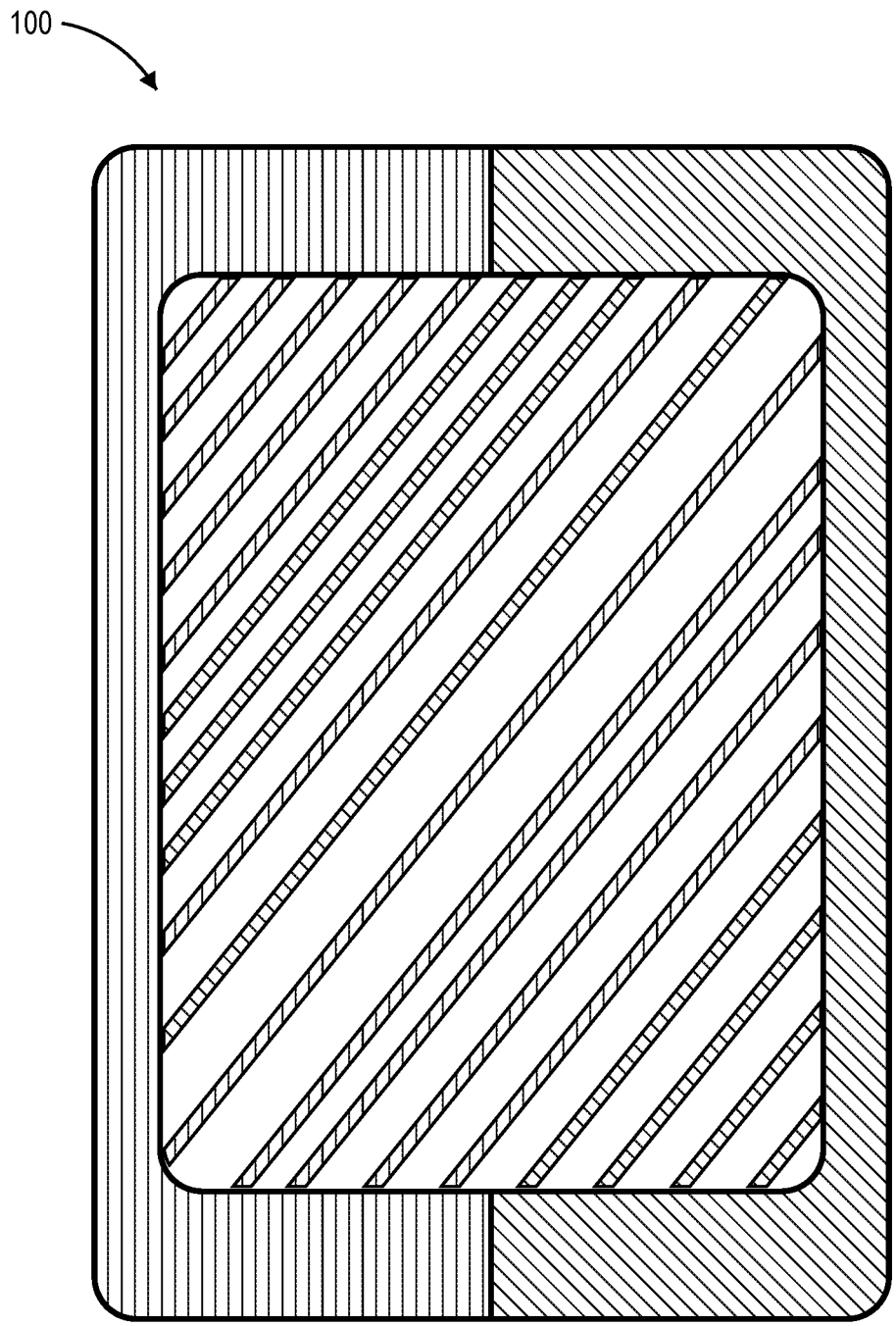
Figure 9:
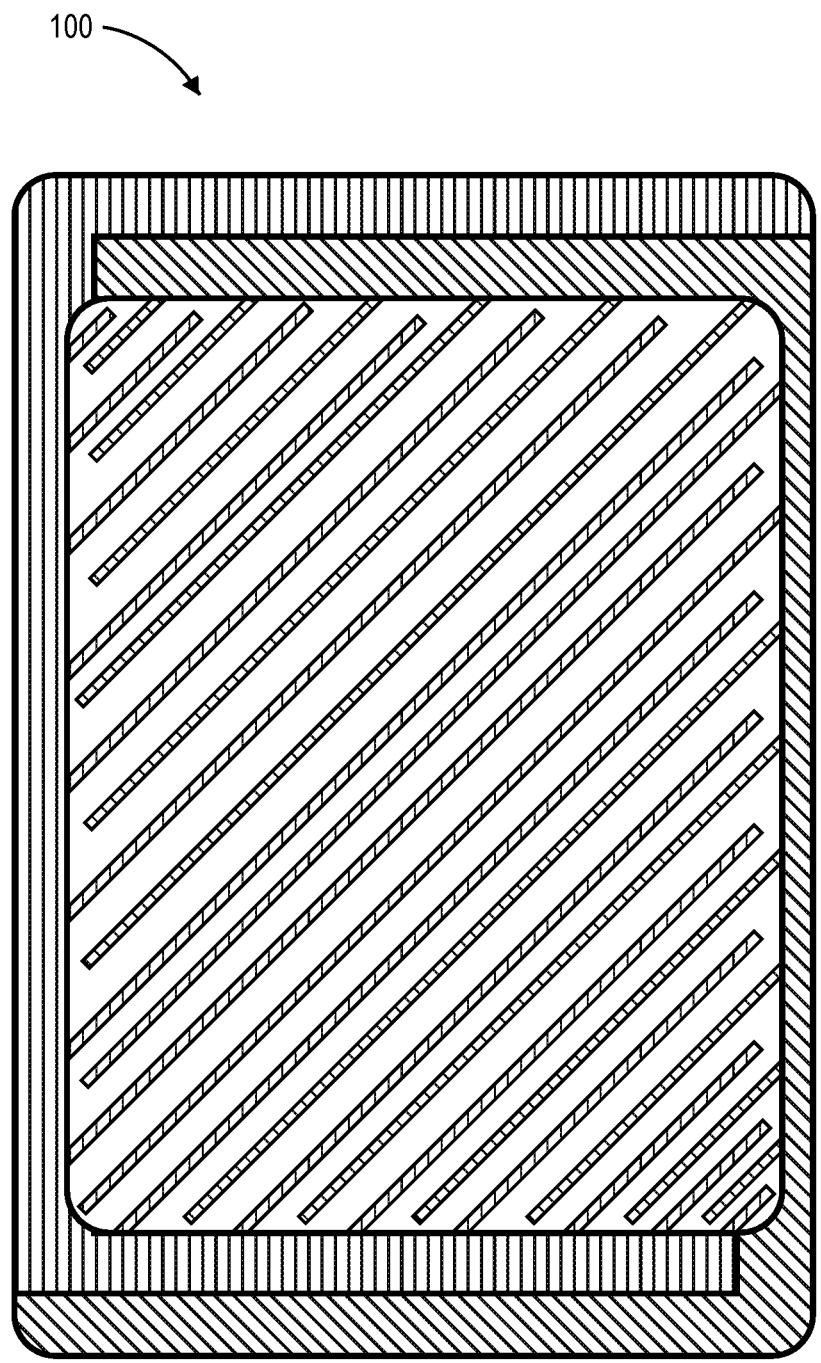

FIG. 6 depicts interior cells (i.e., first cell 102 and second cell 104) and exterior cells (i.e., first exterior cell 106 and second exterior cell 108) configured in an optimized pattern based on an expected use of photovoltaic module 100. The interior cells may be arranged such that the cells are alternating between first cell 102 and second cell 104 and angled at 45 degrees as described above in reference to FIG. 1A. The exterior cells may be arranged in a pattern where first exterior cell 106 is disposed near face 112 on the east side and second exterior cell 108 is near face 112 on the west side of photovoltaic module 100. The arrangement of cells shows an optimized coverage where if photovoltaic module 100 is covered in nearly any direction by a straight line, first cell 102 comprising first exterior cell 106 and second cell 104 comprising second exterior cell 108 have approximately the same surface area exposed to the sun. Consequently, the ratio of cells generating power is approximately 1:1 and the power generation is optimized. FIGS. 7-9 depict alternative optimized configurations of the interior cells and the exterior cells for embodiments of the rectangular electronic device. An arbitrary arrangement of cells for any electronic device may be provided without departing from the scope of the present teachings.

An exemplary embodiment depicted in FIG. 7 present interior cell disposed in a vertical north/south direction with the exterior cells switching between outer and inner configurations at the horizontal splitting face, or dividing, 112 in half. FIG. 8 depicts interior cells arranged at an angle and the exterior cells split at a vertical line splitting face 112 in half vertically. FIG. 9 depicts interior cells configured at an angle with the exterior cells equally coving a top portion of bezel 110 and a bottom portion of bezel 110 and each exterior cell disposed on opposite left and right sides. The configurations provided in FIGS. 7-9 are exemplary only. It should be noted that any configuration of exterior and interior cells may be employed for use in connection with embodiments described herein.

Figure 10A:
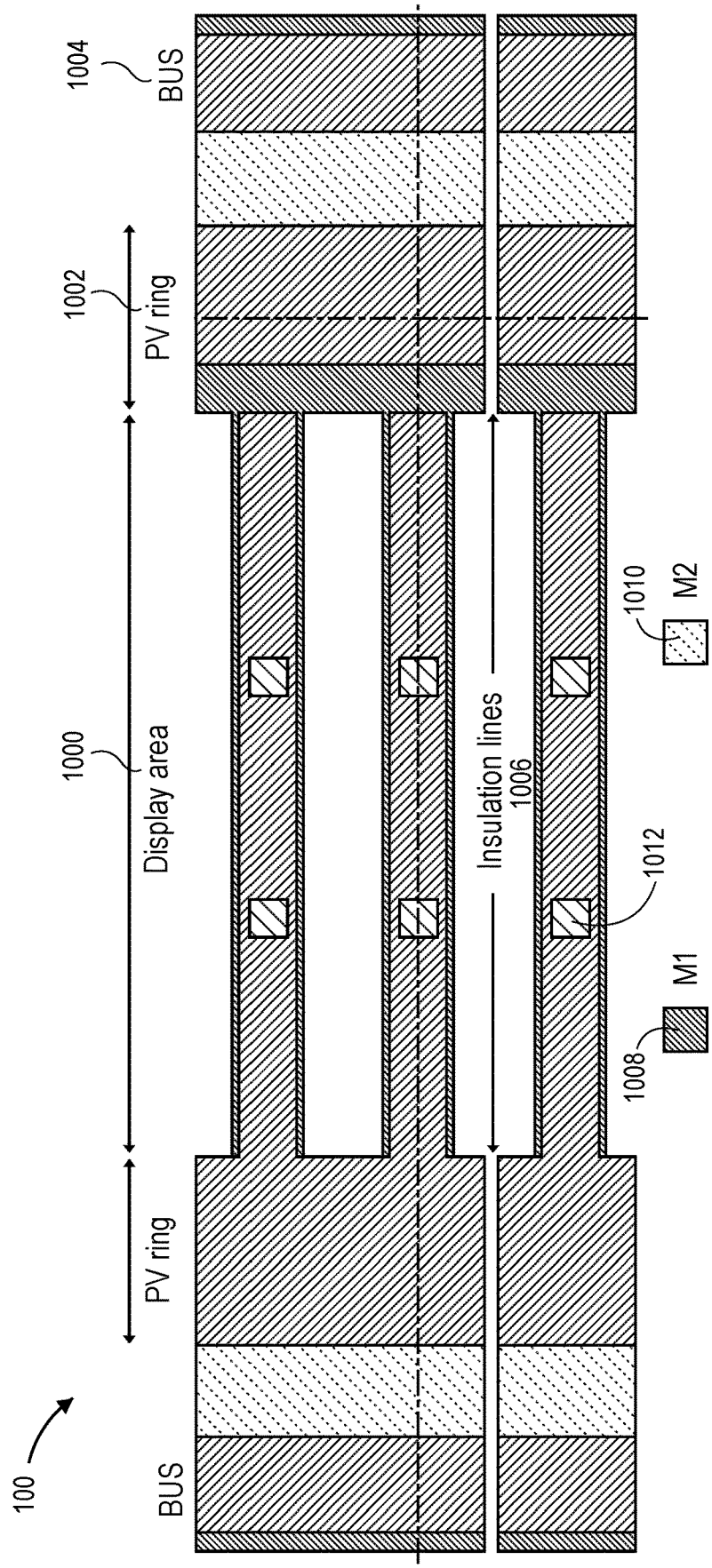
FIGS. 10A-10C, depict an embodiment of photovoltaic cells disposed in an exemplary electronic device.
Figure 10B:
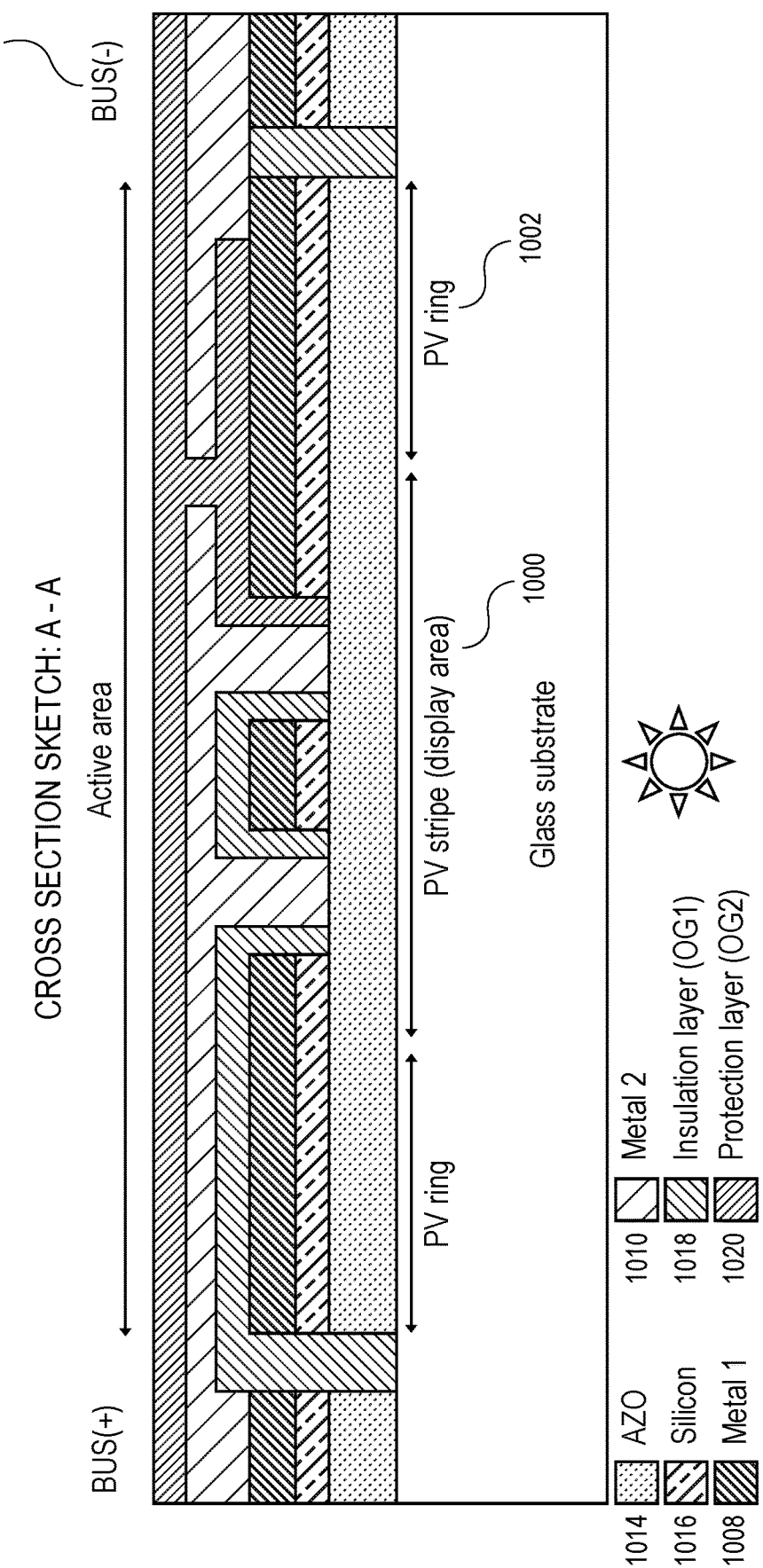
Figure 10C:
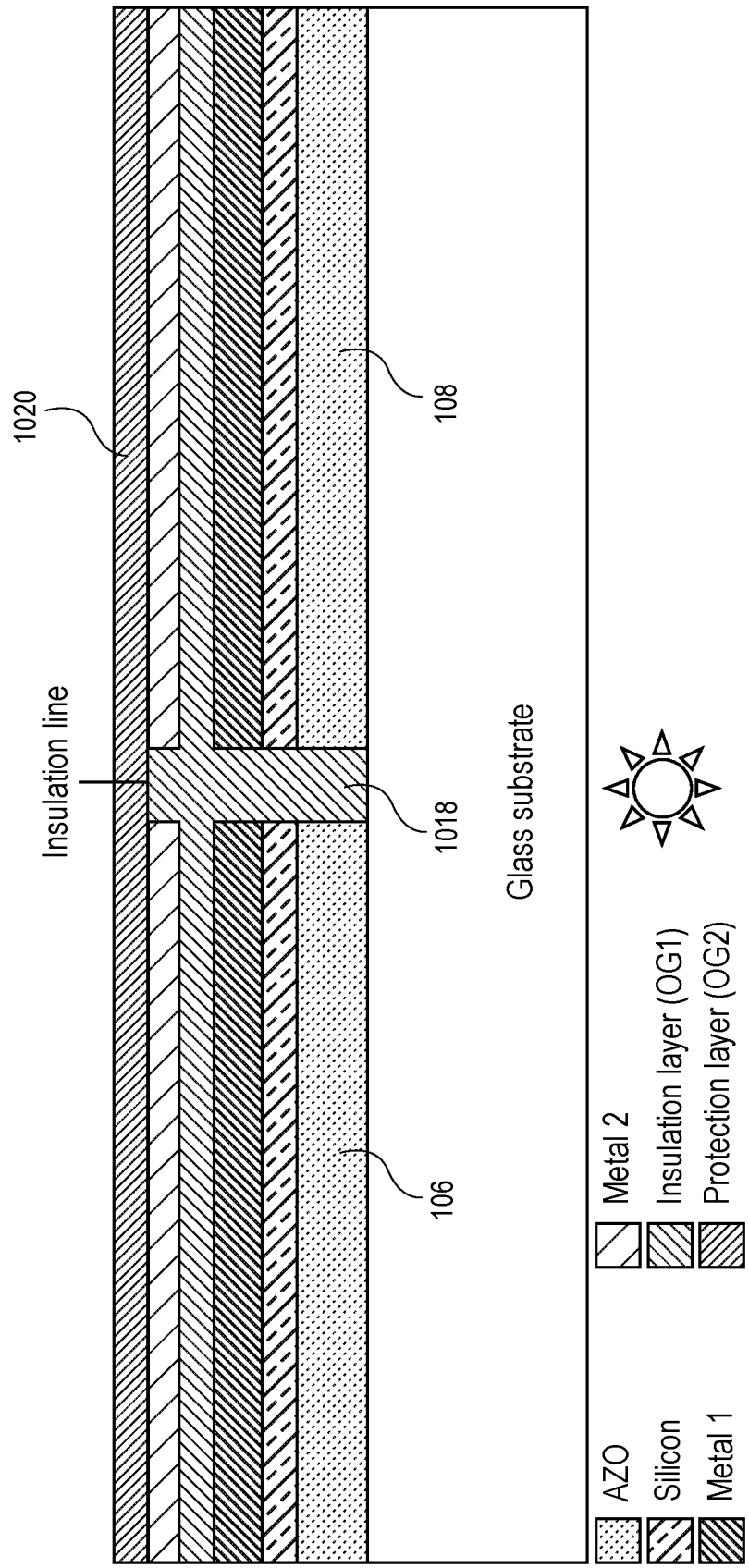

FIGS. 10A-10C depict various cross sections of the interior and the exterior of photovoltaic module 100. Photovoltaic module 100 comprises display area 1000, PV ring 1002, bus 1004, insulation lines 1006, and first electrode 1008 that may comprise first cell 102, and second electrode 1010 that may comprise second cell 104. In some embodiments, cells may be connected by the insulated vias 1012. Cells of the photovoltaic module 100 may be configured as shown in FIGS. 1A-9 above. In multi-cell configurations, insulation lines 1006 between the cells may become visible to the user, detracting from the aesthetic appearance of the device. Illustrated in FIG. 10A, exemplary photovoltaic module 100 is configuration for a smartwatch, where photovoltaic module 100 is intended to be attached above, or otherwise overlay, an electronic smartwatch display. The smartwatch configuration is shown in FIGS. 11-17 and described in detail below. Photovoltaic module 100 includes dense PV ring 1002, for instance comprising 100% PV coverage, that is substantially opaque and intended to ring bezel 110 of the smartwatch. Less dense PV coverage, comprising, for example, lines of photovoltaic material separated between gaps to provide substantial transparency, are overlaid over the center, or face 112, of the display of the smartwatch. First cell 102 and second cell 104 may comprise the lines of photovoltaic material that may be arranged in any of the above-described arrangements over the smartwatch display.

FIG. 10B depicts an exemplary embodiment of the structure of the photovoltaic cells from a cross-section A-A depicted in FIG. 10A. The photovoltaic cells may be first cell 102, second cell 104, first exterior cell 106, and second exterior cell 108 as well as any cells described in single or multi-cell designs herein. The cell structure comprises first electrode 1008, second electrode 1010, aluminum-doped zinc oxide (AZO) layer 1014, silicon layer 1016, insulation layer 1018, and protection layer 1020. In some embodiments, first electrode 1008 and second electrode 1010 are metal electrodes for receiving and conducting electrical current generated by the absorber layers. The metal layers may comprise any conductive material such as, for example, aluminum, copper, zinc, nickel, graphite, carbon, titanium, brass, silver, gold, platinum and palladium, mixed metal oxide, and any alloy or combination thereof.

In some embodiments, first electrode 1008 and second electrode 1010 may comprise either metallic and/or non-metallic material. First electrode 1008 and second electrode 1010 may be any metal that is capable of conducting electricity such as, for example, tin, aluminum, silver, gold, copper, or any combination or alloy of metals. Furthermore, in some embodiments first electrode 1008 and the second electrode may comprise any Transparent Conductive Oxide (TCO) as described below.

In some embodiments, AZO layer may be a TCO material for providing a transparent, or near transparent, conductive electrode. AZO layer 1014 may be any of the TCO described herein. The TCO may comprise doped metal oxides for generating current when exposed to an electromagnetic radiation. In some embodiments, the TCO may be indium tin oxide, doped zinc oxide, or any other doped oxide, organic material, inorganic material, or polymer that may be used as described in embodiments herein. In some embodiments, the TCO is fabricated with crystalline silicon (e.g., microcrystalline silicon), amorphous silicon, and/or a perovskite. Though AZO layer 1014 is described herein, there is no limit to the type of material that may be used for the TCO electrode layers described herein.

In some embodiments, silicon layer 1016 may comprise absorber layers that generate power while being substantially transparent such that a display of the electronic device may be viewed through the photovoltaic cells. The absorber layers may comprise crystalline silicon and/or amorphous silicon and/or a perovskite as well as any doped metal oxides in combination with electrodes for generating current when exposed to electromagnetic radiation.

As described above, first electrode 1008 and second electrode 1010 may comprise metal and/or a TCO layer. In some embodiments, first cell 102 and second cell 104 may comprise metal/absorber/TCO layers and, in some embodiments, first cell 102 and second cell 104 may comprise TCO/absorber/TCO layers. Any combination of material and layers, as well as additional layers, may be included herein.

FIG. 10C depicts bezel 110 displaying a cross section B-B of first exterior cell 106 and second exterior cell 108. First exterior cell 106 may be disposed separately from second exterior cell 108 as described in embodiments above. In some embodiments, insulation layer 1018 and protection layer 1020 may comprise any organic material that has a low conductivity or is non-conductive. In some embodiments, the insulation layer 1016 may be infused with or comprise a photoresist material. The photoresist material may absorb light such that the insulation lines are not visible to the user.

Exemplary Environment

Figure 11:
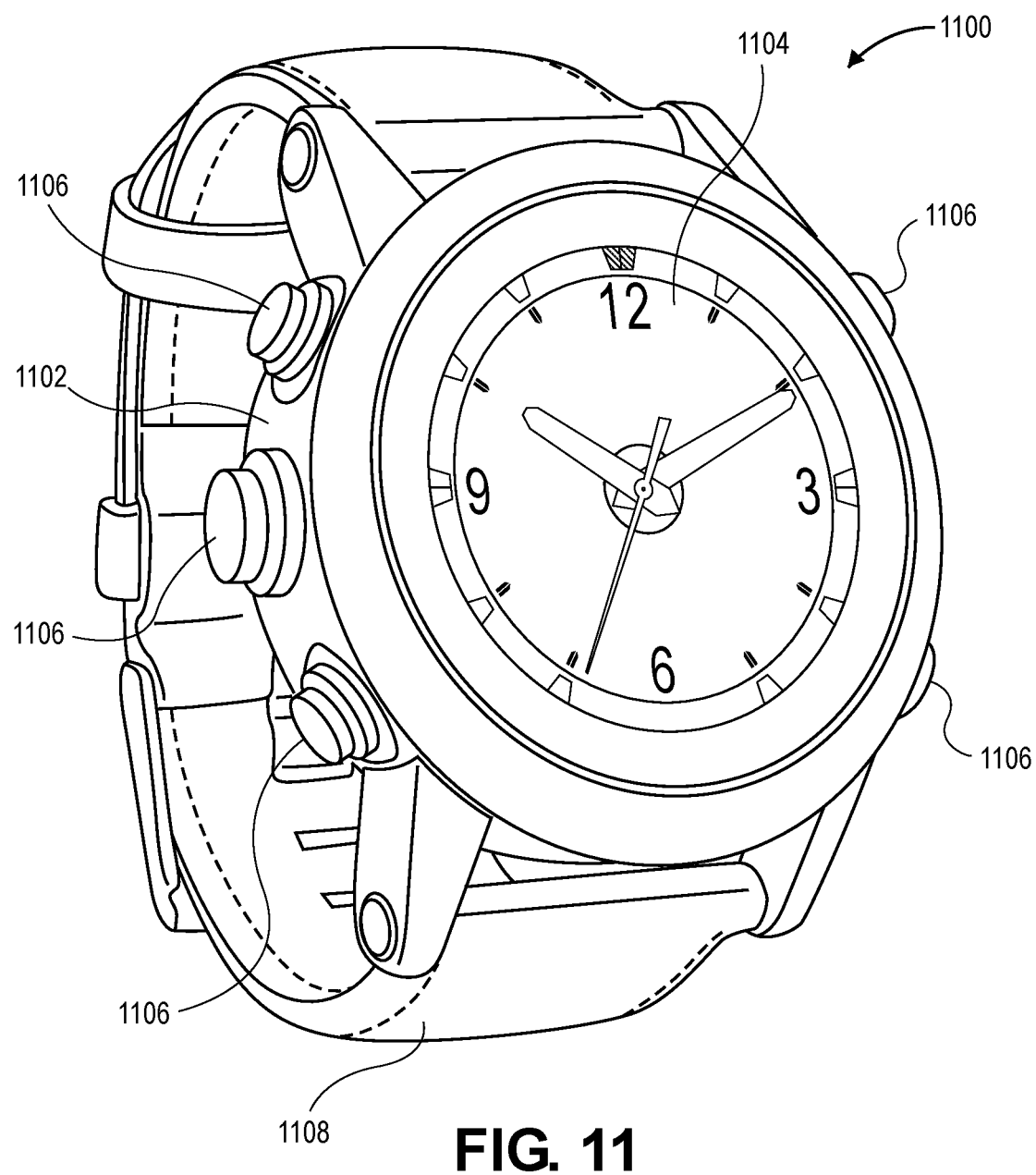
FIG. 11 depicts an exemplary electronic device for use in connection with various embodiments of the invention.

FIG. 11 depicts a perspective view of a mobile electronic device (in this embodiment, smartwatch 1100) in accordance with one or more embodiments of the present disclosure. The photovoltaic cells, described below, may be configured to be disposed in, and power, the mobile electronic device. Exemplary smartwatch 1100 may be operable to provide fitness information and/or navigation functionality to a user of smartwatch 1100. Smartwatch 1100 may be configured in a variety of ways. For instance, smartwatch 1100 may be configured for use during fitness and/or sporting activities and comprise a cycle computer, a sport watch, a golf computer, a smart phone providing fitness or sporting applications (apps), a handheld GPS device used for hiking, and so forth. However, it is contemplated that the present teachings can be implemented in connection with any mobile electronic device. Thus, the mobile electronic device may also be configured as a portable navigation device (PND), a mobile phone, a handheld portable computer, a tablet computer, a personal digital assistant, a multimedia device, a media player, a game device, combinations thereof, and so forth. In the following description, a referenced component, such as mobile electronic device or specifically, smartwatch 1100, may refer to one or more entities, and therefore by convention reference may be made to a single entity (e.g., smartwatch 1100) or multiple entities (e.g., smartwatches 1100, the plurality of smartwatches 1100, and so on) using the same reference number. In some embodiments, the photovoltaic cells may provide power to run all components of the mobile electronic device.

Smartwatch 1100 includes housing 1102. Housing 1102 is configured to house, e.g., substantially enclose, various components of smartwatch 1100. Housing 1102 may be formed from a lightweight and impact-resistant material such as metal or a metal alloy, plastic, nylon, or combinations thereof, for example. Housing 1102 may be formed from a non-conductive material, such a non-metal material, for example. Housing 1102 may include one or more gaskets, e.g., a seal, to make it substantially waterproof or water resistant. Housing 1102 may include a location for a battery and/or another power source for powering one or more components of smartwatch 1100. Housing 1102 may be a singular piece or may include a plurality of sections. In embodiments, housing 1102 may be formed from a conductive material, such as metal, or a semi-conductive material.

In various embodiments, smartwatch 1100 includes viewing area 1104. Viewing area 1104 may include a liquid crystal display (LCD), a thin film transistor (TFT), a light-emitting diode (LED), a light-emitting polymer (LEP), and/or a polymer light-emitting diode (PLED). However, embodiments are not so limited. In various embodiments, viewing area 1104 includes one or more analog or mechanical presentation indicators, such as analog watch hands or mechanical complications or other mechanical gauge or dial indicators. In these embodiments, viewing area 1104 is used to display text and/or graphical information. Viewing area 1104 may be backlit such that it may be viewed in the dark or other low-light environments. However, embodiments are not so limited. Viewing area 1104 may be enclosed by a transparent lens or cover layer that covers and/or protects components of smartwatch 1100. Viewing area 1104 may be backlit via a backlight such that it may be viewed in the dark or other low-light environments. Viewing area 1104 may be provided with a touch screen to receive input (e.g., data, commands, etc.) from a user. For example, a user may operate smartwatch 1100 by touching the touch screen and/or by performing gestures on the screen. In some embodiments, the touch screen may be a capacitive touch screen, a resistive touch screen, an infrared touch screen, combinations thereof, and the like. Smartwatch 1100 may further include one or more input/output (I/O) devices (e.g., a keypad, buttons, a wireless input device, a thumbwheel input device, a trackstick input device, and so on). The I/O devices may include one or more audio I/O devices, such as a microphone, speakers, and so on.

As noted above, in various embodiments, smartwatch 1100 includes one or more mechanical watch hands (e.g., hour hand, minute hand, second hand, and so on) or mechanical complications (date, calendar, dial indicator, and so on). These mechanical watch hands or mechanical complications may be driven by electric motors or other mechanical structures (e.g., spring, wheel, and so on).

Smartwatch 1100 may also include a communication module representative of communication functionality to permit smartwatch 1100 to send/receive data between different devices (e.g., components/peripherals) and/or over the one or more networks. The communication module may be representative of a variety of communication components and functionality including, but not limited to: one or more antennas; a browser; a transmitter and/or receiver; a wireless radio; data ports; software interfaces and drivers; networking interfaces; data processing components; and so forth. Smartwatch 1100 may be configured to communicate via one or more networks with a cellular provider and an Internet provider to receive mobile phone service and various content, respectively. Content may represent a variety of different content, examples of which include, but are not limited to: map data, which may include route information; web pages; services; music; photographs; video; email service; instant messaging; device drivers; real-time and/or historical weather data; instruction updates; and so forth.

The one or more networks are representative of a variety of different communication pathways and network connections which may be employed, individually or in combinations, to communicate among various components. Thus, the one or more networks may be representative of communication pathways achieved using a single network or multiple networks. Further, the one or more networks are representative of a variety of different types of networks and connections that are contemplated including, but not limited to: The Internet; an intranet; a satellite network; a cellular network; a mobile data network; wired and/or wireless connections; and so forth. Examples of wireless networks include but are not limited to: networks configured for communications according to: one or more standard of the Institute of Electrical and Electronics Engineers (IEEE), such as 802.11 or 802.106 (Wi-Max) standards; Wi-Fi standards promulgated by the Wi-Fi Alliance; Bluetooth standards promulgated by the Bluetooth Special Interest Group; and so on. Wired communications are also contemplated such as through universal serial bus (USB), Ethernet, serial connections, and so forth.

In accordance with one or more embodiments of the present disclosure, the smartwatch 1100 includes a control button 1106. As illustrated in FIG. 11, control button 1106 is associated with, e.g., adjacent to, housing 1102. While FIG. 11 illustrates four control buttons 1106 associated with housing 1102, embodiments are not so limited. For example, smartwatch 1100 may include fewer than four control buttons 1106, such as one, two, or three control buttons. Additionally, smartwatch 1100 may include more than four control buttons 1106, such as five, six, or seven, for example. Control button 1106 is configured to control a function of smartwatch 1100. In various embodiments, regions of the viewing area of smartwatch 1100 are covered with a touch sensor as further described below in connection with FIGS. 13-17. In these embodiments, a touchscreen functions as a user interface component to provide input to smartwatch 1100, when a user touches various surface regions of the touchscreen associated with the smartwatch 1100, which regions are configured to control a function of smartwatch 1100.

Figure 12:
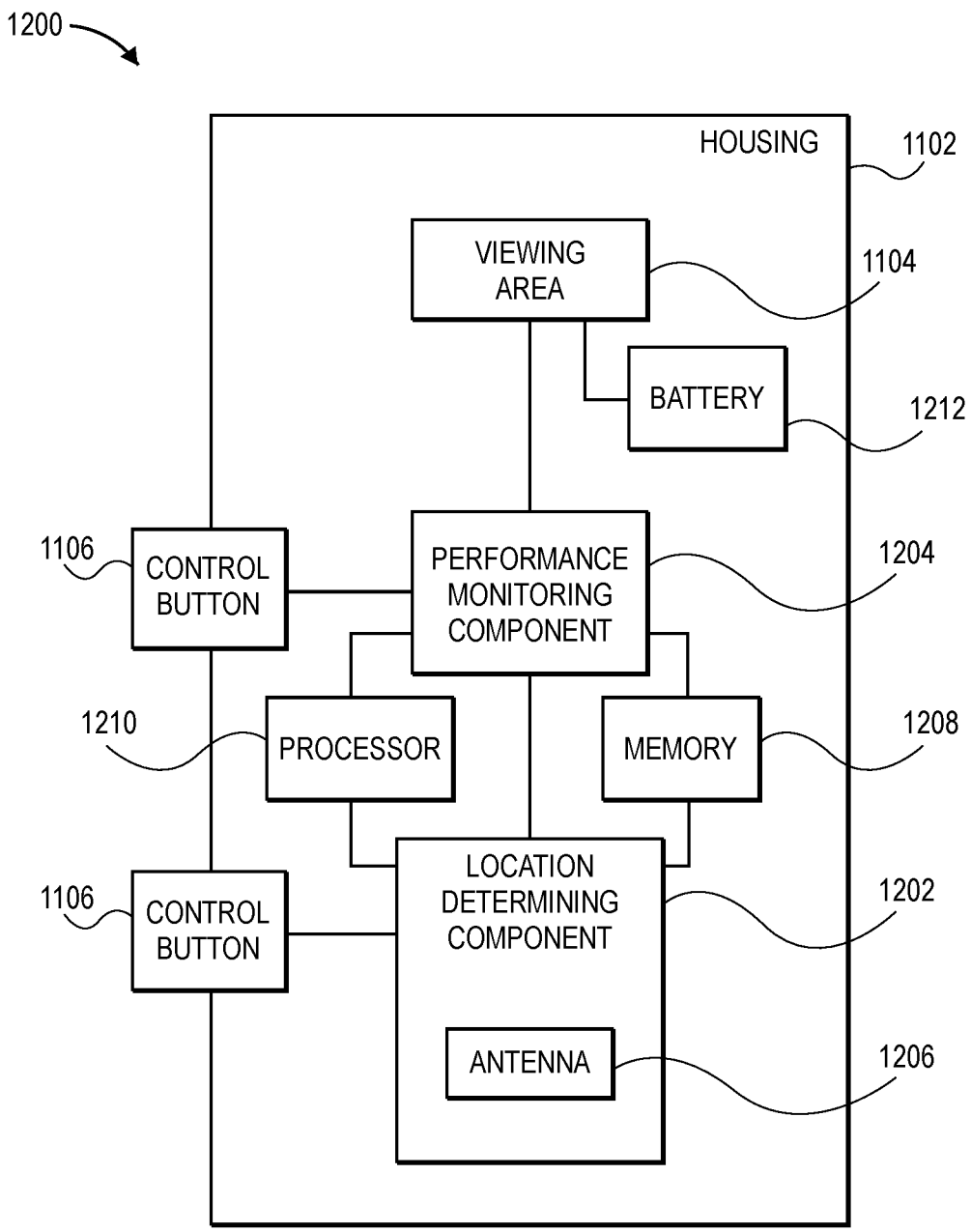
FIG. 12 depicts an exemplary hardware system for use with embodiments of the invention.

Functions of smartwatch 1100 may be associated with location determining component 1202 (FIG. 12) and/or performance monitoring component 1204 (FIG. 12). Functions of smartwatch 1100 may include, but are not limited to, displaying a current geographic location of smartwatch 1100, mapping a location in viewing area 1104, locating a desired location and displaying the desired location on viewing area 1104, monitoring a user's heart rate, monitoring a user's speed, monitoring a distance traveled, calculating calories burned, and the like. In embodiments, user input may be provided from movement of housing 1102. For example, an accelerometer may be used to identify tap inputs on housing 1102 or upward and/or sideways movements of housing 1102. In embodiments, user input may be provided from touch inputs identified using various touch sensing technologies, such as resistive touch or capacitive touch interfaces.

In accordance with one or more embodiments of the present disclosure, smartwatch 1100 includes strap 1108. As illustrated in FIG. 11, strap 1108 is associated with, e.g., coupled to, housing 1102. For example, strap 1108 may be removably secured to housing 1102 via attachment of securing elements to corresponding connecting elements. Examples of securing elements and/or connecting elements include, but are not limited to hooks, latches, clamps, snaps, and the like. Strap 1108 may be made of a lightweight and resilient thermoplastic elastomer and/or a fabric, for example, such that strap 1108 may encircle a portion of a user without discomfort while securing housing 1102 to the user. Strap 1108 may be configured to attach to various portions of a user, such as a user's leg, waist, wrist, forearm, and/or upper arm.

FIG. 12 shows a block diagram 1200 of the internal components of an exemplary mobile electronic device such as smartwatch 1100 of FIG. 11, in accordance with various embodiments of the present disclosure. Housing 1102 can include location determining component 1202 positioned within housing 1102. For example, location determining component 1202 may include antenna 1206 having a ground plane. The ground plane may be formed by coupling a printed circuit board and/or a conductive cage with antenna 1206. Antenna 1206 and the ground plane may be coupled using solder, connection elements, or combinations thereof.

Location determining component 1202 may be a GPS receiver that is configured to provide geographic location information of smartwatch 1100. Location determining component 1202 may be, for example, a GPS receiver such as those provided in various products by GARMIN®. Generally, GPS is a satellite-based radio navigation system capable of determining continuous position, velocity, time, and direction information. Multiple users may simultaneously utilize GPS. GPS incorporates a plurality of GPS satellites that orbit the earth. Based on these orbits, GPS satellites can relay their location to a GPS receiver. For example, upon receiving a GPS signal, e.g., a radio signal, from a GPS satellite, the watch disclosed herein can determine a location of that satellite. The watch can continue scanning for GPS signals until it has acquired a number, e.g., at least three, of different GPS satellite signals. The watch may employ geometrical triangulation, e.g., where the watch utilizes the known GPS satellite positions to determine a position of the watch relative to the GPS satellites. Geographic location information and/or velocity information can be updated, e.g., in real time on a continuous basis, for the watch.

Location determining component 1202 may also be configured to provide a variety of other position-determining functionality. Location determining functionality, for purposes of discussion herein, may relate to a variety of different navigation techniques and other techniques that may be supported by "knowing" one or more positions. For instance, location determining functionality may be employed to provide position/location information, timing information, speed information, and a variety of other navigation-related data. Accordingly, location determining component 1202 may be configured in a variety of ways to perform a wide variety of functions. For example, location determining component 1202 may be configured for outdoor navigation, vehicle navigation, aerial navigation (e.g., for airplanes, helicopters), marine navigation, personal use (e.g., as a part of fitness-related equipment), and so forth. Accordingly, location determining component 1202 may include a variety of devices to determine position using one or more of the techniques previously described.

Location determining component 1202, for instance, may use signal data received via a GPS receiver in combination with map data that is stored in the memory to generate navigation instructions (e.g., turn-by-turn instructions to an input destination or point of interest), show a current position on a map, and so on. Location determining component 1202 may include one or more antennas 1206 to receive signal data as well as to perform other communications, such as communication via one or more networks. Location determining component 1202 may also provide other positioning functionality, such as to determine an average speed, calculate an arrival time, and so on.

Location determining component 1202 may include one or more processors, controllers, and/or other computing devices as well as memory 1208, e.g., for storing information accessed and/or generated by the processors or other computing devices. The processor may be electrically coupled with a printed circuit board and operable to process position determining signals received by antenna 1206. Location determining component 1202, e.g., antenna 1206, is configured to receive position determining signals, such as GPS signals from GPS satellites, to determine a current geographic location of smartwatch 1100. Location determining component 1202 may also be configured to calculate a route to a desired location, provide instructions, e.g., directions, to navigate to the desired location, display maps and other information on the display, and to execute other functions, such as, but not limited to, those functions described herein.

Memory 1208 may store cartographic data and routing used by or generated by location determining component 1202. Memory 1208 may be integral with location determining component 1202, stand-alone memory, or a combination of both. Memory 1208 may include, for example, a removable nonvolatile memory card, such as a TransFlash card. Memory 1208 is an example of device-readable storage media that provides storage functionality to store various data associated with the operation of smartwatch 1100, such as the software program and code segments mentioned above, or other data to instruct the processor and other elements of smartwatch 1100 to perform the techniques described herein. A wide variety of types and combinations of memory may be employed. Memory 1208 may be integral with the processor, stand-alone memory, or a combination of both. Memory 1208 may include, for example, removable and non-removable memory elements such as RAM, ROM, Flash (e.g., SD Card, mini-SD card, micro-SD Card), magnetic, optical, USB memory devices, and so forth.

Antenna 1206, for example, may be configured to receive and/or transmit a signal, such as a GPS signal. Antenna 1206 may be any antenna capable of receiving wireless signals from a remote source, including directional antennas and omnidirectional antennas. Antenna 1206 may include any type of antennas in which the length of the ground plane affects the efficiency of antenna 1206. In accordance with one or more embodiments of the present disclosure, antenna 1206 is an omnidirectional antenna having a ground plane. An omnidirectional antenna may receive and/or transmit in both orthogonal polarizations, depending upon direction. In other words, omnidirectional antennas do not have a predominant direction of reception and/or transmission. Examples of omnidirectional antennas include, but are not limited to, inverted-F antennas (IFAs) and planar inverted-F antennas (PIFAs). In contrast to omnidirectional antennas, directional antennas have a primary lobe of reception and/or transmission over an approximate 70 by 70-degree sector in a direction away from the ground plane. Examples of directional antennas include, but are not limited to, microstrip antennas and patch antennas.

In accordance with one or more embodiments of the present disclosure, antenna 1206 may be an embedded antenna. As used herein, an embedded antenna refers to an antenna that is positioned completely within a device housing. For example, antenna 1206 may be positioned completely within housing 1102. In some embodiments, antenna 1206 may be an external antenna with all or a portion of antenna 1206 exposed from housing 1102.

As discussed, location determining component 1202 includes antenna 1206. Antenna 1206 may be associated with, e.g., formed on and/or within, an antenna support assembly. Alternatively, antenna 1206 may be positioned on a top portion or one or more side portions of the antenna support assembly.

The printed circuit board may support a number of processors, microprocessors, controllers, microcontrollers, programmable intelligent computers (PIC), field-programmable gate arrays (FPGA), other processing components, other field logic devices, application specific integrated circuits (ASIC), and/or memory 1208 that is configured to access and/or store information that is received or generated by smartwatch 1100. Smartwatch 1100 may implement one or more software programs to control text and/or graphical information on the display, as discussed herein. As an example, the printed circuit board may support the bottom portion of the antenna support assembly. In some embodiments, the antenna support assembly and antenna 1206 may be positioned in the center of the top surface, bottom surface, or to a side of the of the printed circuit board.

Processor 1210 may provide processing functionality for smartwatch 1100 and may include any number of processors, micro-controllers, or other processing systems, and resident or external memory for storing data and other information accessed or generated by smartwatch 1100. Processor 1210 may execute one or more software programs that implement the techniques and modules described herein. Processor 1210 is not limited by the materials from which it is formed, or the processing mechanisms employed therein and, as such, may be implemented via semiconductor(s) and/or transistors (e.g., electronic integrated circuits (ICs)), and so forth.

In accordance with one or more embodiments of the present disclosure, functions of smartwatch 1100 may be associated with location determining component 1202 and/or the performance monitoring component 1204. For example, location determining component 1202 is configured to receive signals, e.g., position determining signals, such as GPS signals, to determine a position of smartwatch 1100 as a function of the signals. Location determining component 1202 may also be configured to calculate a route to a desired location, provide instructions to navigate to the desired location, display maps and/or other information in viewing area 1104, to execute other functions described herein, among other things.

Performance monitoring component 1204 may be positioned within housing 1102 and be coupled to location determining component 1202 and viewing area 1104. Performance monitoring component 1204 may receive information, including, but not limited to geographic location information, from location determining component 1202, to perform a function, such as monitoring performance and/or calculating performance values and/or information related to a watch user's movement, e.g., exercise. The monitoring of the performance and/or the calculating performance values may be based at least in part on the geographic location information. The performance values may include, for example, a user's heart rate, speed, a total distance traveled, total distance goals, speed goals, pace, cadence, and calories burned. These values and/or information may be presented in viewing area 1104.

In embodiments, smartwatch 1100 includes a user interface, which is storable in memory 1208 and executable by processor 1210. The user interface is representative of functionality to control the display of information and data to the user of smartwatch 1100 in viewing area 1104. In some implementations, a display module within viewing area 1104 may not be integrated into smartwatch 1100 and may instead be connected externally using universal serial bus (USB), Ethernet, serial connections, and so forth. The user interface may provide functionality to allow the user to interact with one or more applications of smartwatch 1100 by providing inputs via the touch screen and/or the I/O devices. For example, the user interface may cause an application programming interface (API) to be generated to expose functionality to an application to configure the application for display in viewing area 1104 or in combination with another display. In embodiments, the API may further expose functionality to configure the application to allow the user to interact with an application by providing inputs via the touch screen and/or the I/O devices. Applications may comprise software, which is storable in memory 1208 and executable by processor 1210, to perform a specific operation or group of operations to furnish functionality to smartwatch 1100. Example applications may include fitness application, exercise applications, health applications, diet applications, cellular telephone applications, instant messaging applications, email applications, photograph sharing applications, calendar applications, address book applications, and so forth.

In various embodiments, the user interface may include a browser. The browser enables smartwatch 1100 to display and interact with content such as a webpage within the World Wide Web, a webpage provided by a web server in a private network, and so forth. The browser may be configured in a variety of ways. For example, the browser may be configured as an application accessed by the user interface. The browser may be a web browser suitable for use by a full resource device with substantial memory and processor resources (e.g., a smart phone, a personal digital assistant (PDA), etc.). However, in one or more implementations, the browser may be a mobile browser suitable for use by a low-resource device with limited memory and/or processing resources (e.g., a mobile telephone, a portable music device, a transportable entertainment device, wristband, etc.). Such mobile browsers typically conserve battery energy, memory and processor resources, but may offer fewer browser functions than web browsers.

In various embodiments, smartwatch 1100 includes an energy storage device such as battery 1212. It is understood that this energy storage device could employ any conventional or later developed energy storage or chemical battery technology, such as a supercapacitor, for example employing electrostatic double-layer capacitance and electrochemical pseudocapacitance. In various embodiments the energy storage device or battery 1212 includes a lithium polymer battery. As explained in connection with FIG. 11, in various embodiments, control button 1106 is configured to control a function of smartwatch 1100.

In some embodiments, the energy storage device is electrically connected to the photovoltaic cells described herein. The photovoltaic cells may provide power to charge the energy storage device. The photovoltaic cells may be connected directly to the energy storage device or through an intermediate processor for balancing the charge across a plurality of battery cells.

Figure 13:
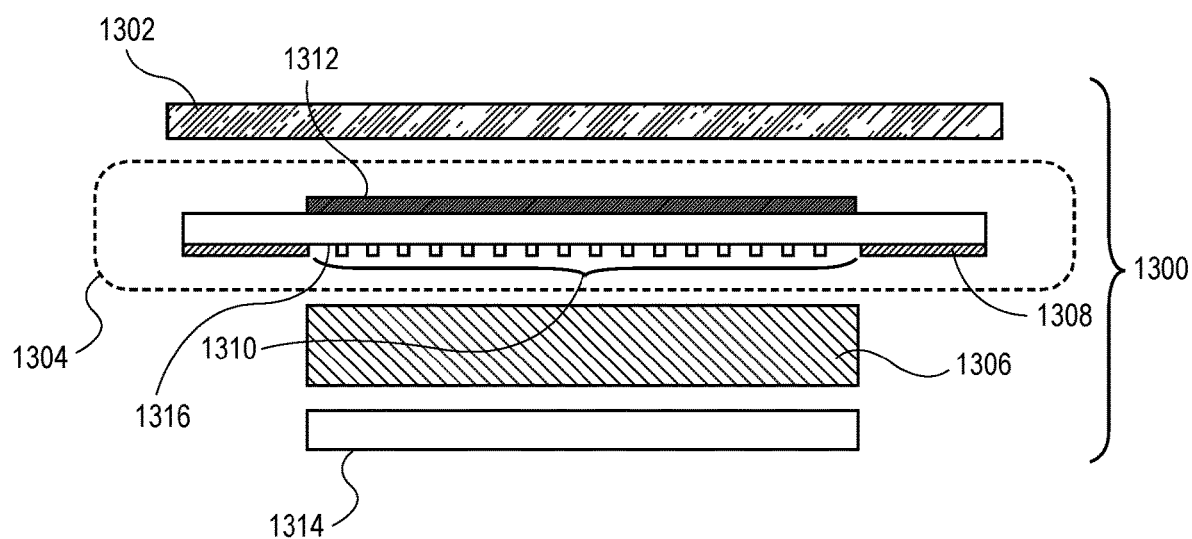
FIG. 13 depicts an exemplary embodiment including various layers of an energy-collecting touchscreen unit.

FIG. 13 illustrates the various layers of energy-collecting touchscreen unit 1300 in accordance with an embodiment of the present disclosure. In various embodiments, a thin, substantially transparent lens or cover layer 1302 is provided. A viewing area within touchscreen unit 1300 can be observed through cover layer 1302, while cover layer 1302 protects touchscreen unit 1300 from physical damage. Moreover, in various embodiments extremely robust, scratch-resistant, and substantially transparent materials are employed, such as sapphire glass which is a synthetically produced crystal that is well-suited for use in touchscreens. In various alternate embodiments, cover layer 1302 is made of Gorilla Glass™ from Corning Incorporated from Corning, N.Y.

In various embodiments, common base layer 1304 is provided immediately beneath cover layer 1302. In various embodiments, an air gap between cover layer 1302 and common base layer 1304 is filled with a substantially transparent optical bonding agent. It is understood that cover layer 1302 can be arbitrarily thin, integral to, and forming a part of common base layer 1304. In an embodiment, common base layer 1304 includes touch sensor 1312 that can be used to sense touch at the surface of touchscreen unit 1300. In various embodiments, common base layer 1304 is made of borosilicate glass. In an embodiment, touch sensor 1312 is a capacitive touch panel ("CTP") made of a transparent conductive material such as indium tin oxide ("ITO") patterned in an array upon the upper face of common base layer 1304 and, in various embodiments, further processed to facilitate the electrical interconnections.

In various embodiments, the bottom face of common base layer 1304 includes materials which provide it with photovoltaic properties. In various embodiments, photovoltaic surface 1316 (as shown in FIGS. 16 and 17) is made up of exterior portion 1308 and interior portion 1310. Photovoltaic surface 1316 is the surface of common base layer 1304 to which interior portion 1308 is applied. In an embodiment, exterior portion 1308 is substantially continuous, meaning that exterior portion 1308 is substantially intact and not etched. By contrast, in various embodiments, interior portion 1310 is photoetched away so that only a minor portion of interior portion 1310 actually covers the surface of common base layer 1304.

In some embodiments, display module 1306 is provided beneath common base layer 1304. In various embodiments, display module 1306 is a liquid crystal pixel array having a pixel pitch of 1026.9 micrometers with each pixel being made up of 9 apertures, 3 apertures for each color sub-pixel. In an embodiment, there is 5 micrometer gap between the apertures. In various embodiments, it is possible to superimpose 10 micrometer wide strips of photovoltaic material such that only 10% of the area of display module 1306 is blocked and the brightness and contrast of the display is only minimally impacted. In an embodiment, the strips of photovoltaic material are superimposed over the columns of the display pixels at a 25-degree tilt angle resulting in a minimal Moire consequence.

In various embodiments, composite photovoltaic surface 1316, which is made up of exterior portion 1308 and interior portion 1310, is circular or substantially congruent to the shape of the face of the smartwatch 1100 or other portable electronic device. The photovoltaic surface is further shown in FIGS. 16 and 17 below. In various embodiments, exterior portion 1308 is made up of an annular ring of substantially continuous photovoltaic material along the distal perimeter of the display. Further, interior portion 1310 of photovoltaic material may be dispersed in a pattern across interior portion 1310 of common base layer 1304 so as to minimally obscure viewing of a viewing area within touchscreen unit 1300. Photovoltaic surface 1316 is positioned on the bottom face of common base layer 1304 between display module 1306 and the common base layer 1304. Touch sensor 1312 is deposited upon the upper face of common base layer 1304. In various embodiments, backlight 1314 is provided so display module 1306 is visible in dark or relatively low-light environments.

FIGS. 14 and 15 illustrate touch sensor 1312 on a front face of common base layer 1304, in accordance with various embodiments of the present disclosure with flexible printed circuit cable 1402 generally referenced by numeral 1400 and without flexible printed circuit cable 1402 generally reference by numeral 1500. In various embodiments the touchscreen aspect of the portable electronic device is provided as by means of the CTP made up of the ITO array on the upper surface of common base layer 1304 shown in FIG. 14. Additionally, flexible printed circuit cable 1402 is provided with connector 1404 that can be connected to electronics associated with smartwatch 1100 such as performance monitoring component 1204 as shown in FIG. 12.

In various embodiments, contact pads made from ITO are provided on the glass surface for electrically interconnecting with flexible printed circuit cable 1402. In various embodiments, contact pads 1502 made of plated copper are provided on flexible printed circuit cable 1402 to facilitate this electrical interconnection. In various embodiments, anisotropic conductive film ("ACF") material which acts like a conductive glue is provided to bond the glass to flexible printed circuit cable 1402. In various embodiments, the CTP array works by detecting differences, or variations, in capacitance between the ITO areas of touch sensor 1312 of FIGS. 14 and 15. Flexible printed circuit cable 1402 includes connector 1404 in such a way that flexible printed circuit cable 1402 can conveniently be folded under common base layer 1304 and plugged into the electronics of smartwatch 1100 before housing 1102 (of FIG. 11) is sealed closed. In various embodiments, the CTP of the top face of common base layer 1304 is either affixed to cover layer 1302 or in very close proximity. In order to improve capacitive touch sensitivity, the distance between the ITO touch sensor (the indium tin oxide pattern on the glass) and the touching object being sensed (e.g., a human finger) is minimized. Additionally, sensitivity is enhanced by minimizing a dielectric constant of the materials in that gap. In various embodiments, for a wearable application such as the smartwatch 1100, the touch sensor 1312 can sense through air gaps between a lens or similar cover layer 1302. It is understood that touch sensor 1312 operates sub-optimally through layers that are conductive or hold an electrical charge. Where an electrical charge builds up on cover layer 1302, with for example an additional anti-glare coating (not shown), the touch sensor 1312 may fail to operate properly when exposed to direct sunlight, for which reason, consistent with the present teachings, materials are selected that do not hold a substantial electrical charge.

As described above, capacitive touch sensitivity is increased by minimizing the dielectric constant of the combination of materials between the touch sensor 1312 and the object being sensed (typically a finger). By way of reference the dielectric constant of ambient air is approximately 1.0 (relative permittivity), while sapphire is about 10 and glass is about 5, with conductive metals having a dielectric constant that is basically infinite. Accordingly, it is understood that, while glass, such as borosilicate glass, allows for greater touch sensitivity than some harder materials, it lacks the protective qualities of sapphire. Accordingly, a material for cover layer 1302 is selected to provide the most physical protection while still providing adequate touch sensitivity. In this way, a position at which a finger or other capacitive pointing device touches the surface of the cover layer 1302 can be accurately determined by changes in the capacitance measured in the ITO pattern and transmitted to various pins of connector 1404.

FIGS. 16 and 17 illustrate photovoltaic surface 1316 on a front face of common base layer 1304, in accordance with various embodiments of the present disclosure. In various embodiments, photovoltaic surface 1316 is formed from one or more layers of doped amorphous silicon which has the advantages of low cost as well as low toxicity compared to some other photovoltaic materials, but it is understood that other photovoltaic materials may be employed without departing from the present teachings. In various embodiments the pattern of interior portion 1310 of photovoltaic surface 1316 is formed by first depositing a substantially uniform layer or layers of photovoltaic material and then removing desired portions of the material by way of photoetching.

In various embodiments, photovoltaic energy is transmitted through cover layer 1302 and the ITO array of touch sensor 1312 (as well as common base layer 1304) into the photovoltaic layer. The photovoltaic layer is made up of the exterior portion 1308 and interior portion 1310 of photovoltaic surface 1316 comprising the photovoltaic cells. The photovoltaic cells then generate electrical current and, therefore, energy in the photovoltaic layer which is then collected by way of conductors at tab 1602 and through flexible printed circuit cable 1402 to be stored in an energy storage device as described in connection with battery 1212 of FIG. 12. Tab 1602 is bonded to common base layer 1304 with ACF to provide an electrical interconnection to flexible printed circuit cable 1402. In some embodiments, the photoelectric cells provided on the photovoltaic surface may be any of the above-described photovoltaic cell designs.

Although the invention has been described with reference to the embodiments illustrated in the attached drawing figures, it is noted that equivalents may be employed, and substitutions made herein without departing from the scope of the invention as recited in the claims.

Having thus described various embodiments of the invention, what is claimed as new and desired to be protected by Letters Patent includes the following:

1. A photovoltaic power system for a portable electronic device, the photovoltaic power system comprising:
a display;
a first photovoltaic cell and a second photovoltaic cell disposed on a face of the electronic device above the display, each of the first photovoltaic cell and the second photovoltaic cell comprising:
a first layer comprising a first transparent conductive electrode;
a second layer electrically connected to the first layer and configured to generate electrical current when exposed to electromagnetic radiation; and
a third layer comprising a second conductive electrode;
wherein substantially equal parts of each of the first photovoltaic cell and the second photovoltaic cell are disposed across a first half of the face and a second half of the face,
wherein the first photovoltaic cell and the second photovoltaic cell are configured as alternating continuous strips across the face of the electronic device and above the display, the alternating continuous strips arranged at an angle of approximately 45 degrees to a vertical axis of the face of the electronic device.

2. The photovoltaic power system of claim 1,
wherein at least a first portion of the first photovoltaic cell and at least a second portion of the second photovoltaic cell is disposed on a bezel encircling the face, and
wherein the second layer comprises at least one of crystalline silicon, amorphous silicon, and a perovskite for generating the electrical current.

3. The photovoltaic power system of claim 1, wherein the first photovoltaic cell comprises a plurality of sub-cells connected in series.

4. The photovoltaic power system of claim 3,
wherein the first conductive electrode is a transparent conductive oxide,
wherein the plurality of sub-cells are disposed separately with sections of the second photovoltaic cell disposed between each sub-cell of the plurality of sub-cells, and
wherein the plurality of sub-cells are connected by insulated vias.

5. The photovoltaic power system of claim 1, further comprising a third photovoltaic cell disposed on a bezel encircling the face.

6. The photovoltaic power system of claim 5, further comprising a fourth photovoltaic cell disposed on the bezel of the portable electronic device, wherein the third photovoltaic cell and the fourth photovoltaic cell are connected in parallel and the third photovoltaic cell and the fourth photovoltaic cell are disposed on the bezel encircling the first photovoltaic cell and the second photovoltaic cell.

7. The photovoltaic power system of claim 5, further comprising a fourth photovoltaic cell disposed on the bezel, wherein an arrangement of the third photovoltaic cell and the fourth photovoltaic cell is such that when at least half of the face is covered by an object substantially equivalent portions of the third photovoltaic cell and the fourth photovoltaic cell are exposed to the electromagnetic radiation.

8. The photovoltaic power system of claim 1, further comprising a capacitive touch panel disposed over the first photovoltaic cell and the second photovoltaic cell and comprising an indium tin oxide array for detecting variations in capacitance, wherein the portable electronic device is at least one of wearable and handheld.

9. A photovoltaic power system for a portable electronic device, the photovoltaic power system comprising:
- a display;
- a first photovoltaic cell and a second photovoltaic cell disposed on a face of the electronic device above the display, each of the first photovoltaic cell and the second photovoltaic cell comprising:
  - a first layer comprising a first transparent conductive electrode;
  - a second layer electrically connected to the first layer and configured to generate electrical current when exposed to electromagnetic radiation; and
  - a third layer comprising a second conductive electrode; and
- a third photovoltaic cell and a fourth photovoltaic cell disposed on a bezel encircling the face, the third photovoltaic cell positioned on a first half of the bezel and the fourth photovoltaic cell positioned on a second half of the bezel,
- wherein substantially equal parts of each of the first photovoltaic cell and the second photovoltaic cell are distributed across a first half and a second half of the face, and
- wherein layers of the first photovoltaic cell are disposed between layers of the second photovoltaic cell as alternating continuous strips across the face of the electronic device and above the display, the alternating continuous strips arranged at an angle of approximately 45 degrees to a vertical axis of the face of the electronic device.

10. The photovoltaic power system of claim 9,
- wherein the first photovoltaic cell comprises a plurality of sub-cells connected in series, and
- wherein the first conductive electrode is a transparent conductive oxide.

11. The photovoltaic power system of claim 10, wherein the plurality of sub-cells are disposed separately with sections of the second photovoltaic cell disposed between each sub-cell of the plurality of sub-cells, and wherein the plurality of sub-cells are connected by insulated vias.

12. The photovoltaic power system of claim 9, wherein the first photovoltaic cell and the second photovoltaic cell are connected in parallel.

13. The photovoltaic power system of claim 9, further comprising:
- a capacitive touch panel disposed over the face and comprising an indium tin oxide array for detecting variations in capacitance; and
- wherein the display is disposed on a side of the face opposite of the capacitive touch panel,
- wherein the portable electronic device is at least one of wearable and handheld.

14. The photovoltaic power system of claim 1, wherein the first photovoltaic cell and the second photovoltaic cell are configured in an asymmetrical pattern across the face of the electronic device.

15. The photovoltaic power system of claim 1, wherein the first photovoltaic cell and the second photovoltaic cell are connected in series.

* * * * *